(12) United States Patent
Vinciarelli et al.

(10) Patent No.: US 11,304,297 B1
(45) Date of Patent: Apr. 12, 2022

(54) PANEL MOLDED ELECTRONIC ASSEMBLIES WITH INTEGRAL TERMINALS

(71) Applicant: Vicor Corporation, Andover, MA (US)

(72) Inventors: Patrizio Vinciarelli, Boston, MA (US); Michael B. LaFleur, East Hampstead, NH (US)

(73) Assignee: Vicor Corporation, Andover, MA (US)

( * ) Notice: Subject to any disclaimer, the term of this patent is extended or adjusted under 35 U.S.C. 154(b) by 0 days.

(21) Appl. No.: 17/026,567

(22) Filed: Sep. 21, 2020

Related U.S. Application Data

(62) Division of application No. 16/218,395, filed on Dec. 12, 2018, now Pat. No. 10,785,871.

(51) Int. Cl.
*H05K 1/11* (2006.01)
*H05K 1/14* (2006.01)
(Continued)

(52) U.S. Cl.
CPC ............ *H05K 1/113* (2013.01); *H05K 1/116* (2013.01); *H05K 1/181* (2013.01); *H05K 1/184* (2013.01);
(Continued)

(58) Field of Classification Search
CPC ... H05K 1/11; H05K 1/14; H05K 3/30; H05K 3/284; H05K 5/02; H05K 7/02; H05K 7/14; H05K 7/20; H01L 21/56; H01L 21/70; H01R 13/52
USPC ............... 174/261, 254, 255, 262, 265, 266; 361/736, 752, 826; 257/678, 758, 773; 439/76.2, 82, 276, 936; 29/841, 852
See application file for complete search history.

(56) References Cited

U.S. PATENT DOCUMENTS 3,846,741 A 11/1974 Kunkle et al.
4,211,603 A 7/1980 Reed
(Continued)

FOREIGN PATENT DOCUMENTS

EP 2863531 4/2015
JP H02280666 11/1990
(Continued)

OTHER PUBLICATIONS

U.S. Appl. No. 14/731,287, filed Jun. 4, 2015, Vinciarelli et al.
(Continued)

*Primary Examiner* — Xiaoliang Chen
(74) *Attorney, Agent, or Firm* — Fish & Richardson P.C.

(57) ABSTRACT

Encapsulated electronic modules having complex contact structures may be formed by encapsulating panels containing a substrate comprising pluralities of electronic modules delineated by cut lines and having conductive interconnects buried within terminal holes and other holes drilled in the panel within the boundaries of the cut lines. Slots may be cut in the panel along the cut lines. The interior of the holes, as well as surfaces within the slots and on the surfaces of the panel may be metallized, e.g. by a series of processes including plating. Terminals may be inserted into the terminal holes and connected to conductive features or plating within the holes. A conductive element may be provided on the substrate to connect to a terminal. Alternatively solder may be dispensed into the holes for surface mounting.

9 Claims, 19 Drawing Sheets

(51) Int. Cl.

| | | |
|---|---|---|
| *H05K 3/30* | (2006.01) | |
| *H05K 5/02* | (2006.01) | |
| *H05K 7/02* | (2006.01) | |
| *H05K 7/14* | (2006.01) | |
| *H05K 7/20* | (2006.01) | |
| *H01L 21/56* | (2006.01) | |
| *H01L 21/70* | (2006.01) | |
| *H01R 13/52* | (2006.01) | |
| *H05K 3/42* | (2006.01) | |
| *H05K 3/24* | (2006.01) | |
| *H05K 3/34* | (2006.01) | |
| *H05K 1/18* | (2006.01) | |

(52) U.S. Cl.
CPC ........... *H05K 3/243* (2013.01); *H05K 3/3405* (2013.01); *H05K 3/429* (2013.01)

(56) References Cited

U.S. PATENT DOCUMENTS

| | | |
|---|---|---|
| 4,223,970 A | 9/1980 | Walter |
| 4,230,385 A | 10/1980 | Ammon et al. |
| 4,394,711 A | 7/1983 | Conley |
| 4,526,429 A | 7/1985 | Kirkman |
| RE32,212 E | 7/1986 | Walter et al. |
| 4,742,477 A | 5/1988 | Phillips et al. |
| 4,917,526 A | 4/1990 | Paterson |
| 5,168,432 A | 12/1992 | Murphy et al. |
| 5,206,795 A | 4/1993 | Belanger, Jr. |
| 5,321,351 A | 6/1994 | Swart et al. |
| 5,408,189 A | 4/1995 | Swart et al. |
| 5,728,600 A | 3/1998 | Vinciarelli et al. |
| RE36,442 E | 12/1999 | Kardos |
| 6,001,671 A | 12/1999 | Fjelstad |
| 6,028,354 A | 2/2000 | Hoffman |
| 6,031,253 A | 2/2000 | Kobayashi |
| 6,031,743 A | 2/2000 | Carpenter et al. |
| 6,035,261 A | 3/2000 | Carpenter et al. |
| 6,110,213 A | 8/2000 | Vinciarelli et al. |
| 6,116,916 A | 9/2000 | Kasai |
| 6,230,403 B1 | 5/2001 | Skoolicas et al. |
| 6,275,958 B1 | 8/2001 | Carpenter et al. |
| 6,403,009 B1 | 6/2002 | Saxelby, Jr. et al. |
| 6,421,262 B1 | 7/2002 | Saxelby et al. |
| 6,466,458 B2 | 10/2002 | Zhang et al. |
| 6,586,822 B1 | 7/2003 | Vu |
| 6,646,886 B1 | 11/2003 | Popovich et al. |
| 6,788,033 B2 | 9/2004 | Vinciarelli |
| 6,847,853 B1 | 1/2005 | Vinciarelli et al. |
| 6,911,848 B2 | 6/2005 | Vinciarelli |
| 6,930,893 B2 | 8/2005 | Vinciarelli et al. |
| 6,934,166 B2 | 8/2005 | Vinciarelli et al. |
| 6,969,909 B2 | 11/2005 | Briere |
| 6,975,098 B2 | 12/2005 | Vinciarelli et al. |
| 6,984,965 B2 | 1/2006 | Vinciarelli et al. |
| 6,985,341 B2 | 1/2006 | Vinciarelli et al. |
| 7,015,587 B1 | 3/2006 | Poddar |
| 7,030,469 B2 | 4/2006 | Mahadevan et al. |
| 7,145,786 B2 | 12/2006 | Vinciarelli et al. |
| 7,187,263 B2 | 3/2007 | Vinciarelli et al. |
| 7,190,057 B2 | 3/2007 | Seki |
| 7,198,987 B1 | 4/2007 | Warren |
| 7,268,425 B2 | 9/2007 | Mallik |
| 7,294,007 B1 | 11/2007 | Lawlyes |
| RE40,072 E | 2/2008 | Prager et al. |
| 7,361,844 B2 | 4/2008 | Vinciarelli et al. |
| 7,494,843 B1 | 2/2009 | Lin et al. |
| 7,561,446 B1 | 7/2009 | Vinciarelli |
| 7,772,036 B2 | 8/2010 | Bauer et al. |
| 8,138,584 B2 | 3/2012 | Wang |
| 8,263,434 B2 | 9/2012 | Pagaila |
| 8,427,269 B1 | 4/2013 | Vinciarelli et al. |
| 8,582,333 B2 | 11/2013 | Oraw et al. |
| 8,966,747 B2 | 3/2015 | Vinciarelli |
| 9,112,422 B1 | 8/2015 | Vinciarelli |
| 9,166,481 B1 | 10/2015 | Vinciarelli et al. |
| 9,324,672 B2 | 4/2016 | Pagaila |
| 9,402,319 B2 | 7/2016 | Vinciarelli et al. |
| 9,516,761 B2 | 12/2016 | Vinciarelli |
| 9,936,580 B1 | 4/2018 | Vinciarelli et al. |
| 10,014,798 B1 | 7/2018 | Vinciarelli et al. |
| 10,020,752 B1 | 7/2018 | Vinciarelli et al. |
| 10,158,357 B1 | 12/2018 | Vinciarelli et al. |
| 10,231,333 B1 | 3/2019 | Liu et al. |
| 10,264,664 B1 | 4/2019 | Vinciarelli et al. |
| 10,277,105 B1 | 4/2019 | Vinciarelli et al. |
| 10,390,437 B2 | 8/2019 | Kudou et al. |
| 10,512,182 B2 * | 12/2019 | Suzuki .............. H05K 7/20472 |
| 2001/0018285 A1 | 8/2001 | Mizumura |
| 2001/0018286 A1 | 8/2001 | Mizumura |
| 2001/0023980 A1 | 9/2001 | Ohmori |
| 2001/0032388 A1 | 10/2001 | Morris |
| 2003/0087538 A1 | 5/2003 | Ueno |
| 2003/0162434 A1 | 8/2003 | Kamiya |
| 2003/0168499 A1 | 9/2003 | Tanabe et al. |
| 2004/0207089 A1 * | 10/2004 | Masuda ................. H01L 25/065 257/758 |
| 2004/0251554 A1 | 12/2004 | Masuda |
| 2005/0048692 A1 | 3/2005 | Hanada et al. |
| 2006/0127652 A1 | 6/2006 | Kanaya et al. |
| 2006/0180346 A1 | 8/2006 | Knight et al. |
| 2006/0272150 A1 * | 12/2006 | Eguchi ................... H05K 3/284 29/841 |
| 2007/0241440 A1 | 10/2007 | Hoang et al. |
| 2008/0078572 A1 | 4/2008 | Watanabe et al. |
| 2013/0083495 A1 | 4/2013 | Moon et al. |
| 2014/0355218 A1 | 12/2014 | Vinciarelli et al. |
| 2016/0128215 A1 | 5/2016 | Kanzaki et al. |
| 2017/0013748 A1 | 1/2017 | Saji et al. |
| 2017/0115144 A1 | 4/2017 | Watanabe et al. |
| 2017/0336584 A1 | 11/2017 | Ariga et al. |
| 2019/0080931 A1 | 3/2019 | Ito et al. |

FOREIGN PATENT DOCUMENTS

| | | |
|---|---|---|
| JP | H04293293 | 10/1992 |
| WO | WO 2004/017399 | 2/2004 |

OTHER PUBLICATIONS

U.S. Appl. No. 14/822,561, filed Aug. 10, 2015, Vinciarelli.
U.S. Appl. No. 14/874,054, filed Oct. 2, 2015, Vinciarelli.
Amendment after Allowance Pursuant to 37 C.F.R. §1.312 in U.S. Appl. No. 13/044,063, dated Mar. 3, 2015, 17 pages.
An2738, Application Note AN2738, "L6390 half-bridge gate driver," STMicroelectronics, Aug. 2009.
AND8311/D "Understanding the LLC Structure in Resonant Applications," Christophe Basso, ON Semiconductor, Jan. 2008) (Year: 2008).
Brown "Point of Load Converters —The Topologies, Converters, and Switching Devices Required for Efficient Conversion," Jess Brown, Vishay Siliconix, Presented at PCIM Conference, May 2002) (Year: 2002).
Burton et al., "FIVR—Fully Integrated Voltage Regulators on 4th Generation Intel ® Core™ SoCs," In Applied Power Electronics Conference and Exposition (APEC), 2014 Twenty-Ninth Annual IEEE, Mar. 16, 2014, 432-439.
Cao et al., "A Family of Zero Current Switching Switched-Capacitor DC-DC converters," Applied Power Electronics Conference and Exposition (APEC), 2010 Twenty-Fifth Annual IEEE, Mar. 18, 2010.
Cao et al., "Zero-Current-Switching Multilevel Modular Switched-Capacitor DC-DC Converter " IEEE Transactions on Industry Applications, 46(6):2536-2544, Sep. 2010.
DiBene II et al., "A 400 Amp Fully Integrated Silicon Voltage Regulator with in-die Magnetically Coupled Embedded Inductors," retrieved from http://www.psma.com/sites/default/files/uploads/tech-forums-nanotechnology/resources/400a-fully-integrated-silicon-voltage-regulator.pdf, retrieved on Aug. 3, 2016, 25 pages.

(56) References Cited

OTHER PUBLICATIONS

European Office Action in European Application No. 16173089.0, dated Apr. 10, 2017, 2 pages.
Extended Search Report in European Application No. 16173089.0, dated Feb. 14, 2017, 8 pages.
ISL6210, Datasheet ISL6210, "Dual Synchronous Rectified MOSFET Drivers," Intersil Americas Inc., Dec. 2008.
Miller, "12V PowerStage in Embedded Die System-in-Package," APEC 2015, 33 pages.
Notice of Allowance in U.S. Appl. No. 13/044,063, dated Feb. 20, 2015, 15 pages.
Notice of Allowance in U.S. Appl. No. 13/044,063, dated Jun. 5, 2015, 11 pages.
Notice of Allowance in U.S. Appl. No. 14/682,187, dated Jan. 17, 2017, 22 pages.
Notice of Allowance in U.S. Appl. No. 15/091,346, dated Aug. 13, 2018, 8 pages.
Notice of Allowance in U.S. Appl. No. 15/091,346, dated May 21, 2018, 9 pages.
Notice of Allowance in U.S. Appl. No. 15/616,288, dated Dec. 11, 2018, 9 pages.
Office Action in U.S. Appl. No. 13/044,063, dated May 23, 2014, 24 pages.
Okudaira and Matsuse, "A New Quasi-Resonant Inverter With Two-way Short-circuit Switch Across A Resonant Capacitor," Power Conversion Conference 2002, 2002, 1496-1501.
Oraw et al., "Load Adaptive, High Efficiency, Switched Capacitor Intermediate Bus Converter," Telecommunications Energy Conference, IEEE 2007, pp. 628-635 Sep. 30-Oct. 4, 2007.
Reply to Action of May 23, 2014 in U.S. Appl. No. 13/044,063, dated Oct. 24, 2014, 39 pages.
Seeman et al., "Analysis and optimization of switched-capacitor dc-dc converters," Power Electronics, IEEE Transactions on, vol. 23, pp. 841-851, Mar. 2008.
Supplemental Notice of Allowability in U.S. Appl. No. 13/044,063, dated Apr. 20, 2015, 5 pages.
TND359 ("High-Efficiency 255W ATX Power Supply Reference Design Documentation Package," ON Semiconductor, Jan. 2009) (Year: 2009).
Watson, "New Techniques in the Design of Distributed Power System," Dissertation, 1998, 32 pages.
Yeung et al., "Generalised analysis of switched-capacitor step-down quasi-resonant converter," Electronics Letters, vol. 38, pp. 263-264, 2002.
Yeung et al., "Zero-current switching switched-capacitor quasiresonant step-down converter," Electric Power Applications, IEE Proceedings-, vol. 149, pp. 111-121, 2002.

\* cited by examiner

PANEL MOLDED ELECTRONIC ASSEMBLIES WITH INTEGRAL TERMINALS

CROSS-REFERENCE TO RELATED APPLICATION

This is a divisional of U.S. patent application Ser. No. 16/218,395, filed on Dec. 12, 2018, the entire disclosure of which is incorporated herein by reference.

FIELD OF THE INVENTION

This invention relates to the field of encapsulated electronic assemblies, including encapsulated power converters, and more particularly to providing externally accessible connection terminals that provide a conductive path to elements within the encapsulated assembly.

BACKGROUND

An encapsulated electronic module, such as an electronic power converter module for example, may comprise a printed circuit assembly over-molded with an encapsulant to form some or all of the package and exterior structure or surfaces of the module. Encapsulation in this manner may aid in conducting heat out of the over-molded components, i.e., components that are mounted on the printed circuit assembly and covered with encapsulant. It is necessary to provide means for making electrical connections between the internal printed circuit assembly and external circuitry (e.g. an external printed circuit board; a socket). There are many known ways to make such connections, including, but not limited to, lead frames, pins, conductive terminals and flexible wire leads.

SUMMARY

In general, in one aspect, a method of forming electronic modules is provided. The method includes: assembling an electronic module including a multilayer printed circuit board ("PCB") having a plurality of conductive layers, a first plurality of electronic components mounted to a first surface of the PCB, and a first layer of cured encapsulant covering the components and the surface of the PCB, the first layer of cured encapsulant forming a first exterior surface of the module, the electronic module including one or more conductive features buried beneath the first exterior surface; selectively forming one or more terminal holes in the first exterior surface through the first layer at predetermined locations within perimeter boundaries of the electronic module, exposing within the one or more terminal holes respective portions of the one or more conductive features; inserting a conductive terminal into each of the one or more terminal holes; and forming an electrical connection between the conductive terminal and the respective portions of the one or more conductive features exposed within each of the one or more terminal holes.

Implementations of the aspect can include one or more of the following features. The method can further include selectively forming one or more conductive metal layers on the first exterior surface and on a sidewall surface within each of selected terminal holes in electrical contact with the respective portions of the one or more conductive features exposed within the selected terminal holes. The one or more conductive features further can include at least one of the conductive layers, at least one of the terminal holes are formed through a portion of the PCB, and the respective portions of the one or more conductive features include edges of the at least one of the conductive layers. Forming an electrical connection can include, for each selected terminal hole, soldering the respective conductive terminal to the conductive metal layer within the selected terminal hole or the respective portions of the one or more conductive features exposed within the selected terminal hole, or both. Each respective conductive terminal can include a columnar portion that extends beyond the first exterior surface of the electronic module and can be adapted to engage with a through hole in a second printed circuit board external to the electronic module. Each respective conductive terminal can include a threaded hole adapted to accept a threaded fastener.

Forming an electrical connection for selected terminal holes can include forming a pressure fit between the respective conductive terminal and the respective portions of the one or more conductive features exposed within the selected terminal holes. The selected terminal holes each can have a circular cross-section and each respective terminal can include a portion lying within each selected terminal hole having indentations providing gaps between the portion of the terminal and the sidewall surface of the hole. The indentations can be adapted to allow gases to escape from the selected holes during the soldering. The indentations can include features adapted to resist rotation of the terminal in the terminal hole. Assembling the electronic module can include mounting at least one conductive component to the PCB, the at least one conductive component can be covered by the first layer of cured encapsulant, and forming the one or more terminal holes can include exposing the conductive component in a respective one of the terminal holes. The conductive component can include a hole feature covered by the first layer of cured encapsulant and approximately aligned with a location of the respective one of the terminal holes, and the respective one of the terminal holes can expose the hole feature.

Forming one or more conductive metal layers can include patterning to produce a metal pad on an external surface of the electronic module surrounding the terminal holes, the metal forming the pad can be continuous with the metal extending into the at least one terminal hole, and the metal pad can provide an electrical contact on the external surface connected to the one or more exposed features. Forming an electrical connection can include soldering the conductive terminal to the metal within the selected terminal hole or the pad on the external surface, or both. The method can further include selectively forming one or more conductive metal layers on a sidewall surface within each of selected terminal holes in electrical contact with the respective portions of the one or more conductive features exposed within the selected terminal holes.

The method can further include: selectively forming one or more mounting holes in the first exterior surface through the first layer at predetermined locations within perimeter boundaries of the electronic module, each mounting hole intersecting a respective second set of the conductive features to expose respective portions of the respective second set of conductive features in the respective mounting hole. The method can further include: selectively forming one or more conductive metal layers on the first external surface and on a sidewall surface within each of selected mounting holes in electrical contact with the exposed respective portions of the respective second set of conductive features in the respective mounting hole to form a conductive metal mounting pad on the first exterior surface surrounding the respective mounting hole, the metal mounting pad being continuous with the one or more conductive metal layers on the interior surface of the respective mounting hole and providing an electrical contact on the first exterior surface connected to the exposed respective portions of the respective second set of the conductive features.

The method can further include patterning the one or more metal layers on the first exterior surface to form a metal shield electrically connected to at least one of the metal mounting pads and covering at least 25 percent of the first exterior surface. The metal shield can cover at least 50% of the exterior module surface and connect a plurality of the mounting holes. At least one of the mounting holes can extend completely through the module. Assembling the electronic module can include providing a PCB panel, mounting a plurality of electronic components to first and second surfaces of the PCB panel, encapsulating the PCB panel and electronic components to form an encapsulated panel, the encapsulated panel comprising a plurality of the electronic modules, and cutting the encapsulated panel to singulate the electronic modules. In some examples, the cutting step can be performed after the steps of forming the terminal holes and forming one or more conductive metal layers. In some examples, the cutting can be performed after the step of inserting the conductive terminal. In some examples, the cutting can be performed before the step of inserting the conductive terminal. Selectively forming one or more terminal holes can further include using a laser, and the one or more conductive features can include a conductive feature on the first surface of the PCB. The laser can include a wavelength that removes encapsulant at a rate that is at least an order of magnitude greater than a rate at which material is removed from the conductive feature on the first surface of the PCB. The one or more holes can be limited in depth by the conductive feature on the first surface of the PCB.

In general, in another aspect, apparatus includes an electronic module including a multilayer printed circuit board ("PCB") having a plurality of conductive layers, a first plurality of electronic components mounted to a first surface of the PCB, and a first layer of cured encapsulant covering the first plurality of components and the first surface of the PCB, the first layer of cured encapsulant forming a first exterior module surface. The apparatus includes one or more conductive features buried beneath the first exterior module surface; and one or more terminal holes formed in the first layer of cured encapsulant, each terminal hole intersecting a respective set of the conductive features to expose respective portions of the selected set of the conductive features and having a respective conductive terminal within the terminal hole and electrically connected to the respective portions of the respective set of conductive features.

Implementations of the aspect can include one or more of the following features. The apparatus can include a conductive metal layer formed on an interior surface of selected terminal holes in contact with the respective portions of the respective set of conductive features within the respective terminal hole. The selected set of conductive features can include one or more of the conductive layers of the PCB, each selected terminal hole can be formed through at least a portion of the PCB, and the respective portions of the one or more conductive features can include edges of the one or more conductive layers. The apparatus can further include a conductive metal pad formed on the first exterior module surface surrounding one or more of the selected terminal holes, the metal pad can be continuous with the conductive metal layer on the interior surface of the one or more of the selected terminal holes and provide an electrical contact on the first exterior module surface connected to the one or more exposed features within the respective terminal hole. The apparatus can further include a solder connection between a portion of the conductive terminal and the conductive metal layer on the interior surface of the one or more selected terminal holes. The apparatus can further include a solder connection between a portion of the conductive terminal the conductive metal pad.

The apparatus can further include one or more mounting holes formed in the first layer of cured encapsulant, each mounting hole can intersect a respective second set of the conductive features to expose respective portions of the respective second set of conductive features in the respective mounting hole. Each mounting hole can have a conductive metal layer formed on an interior surface of the respective mounting hole in contact with the exposed respective portions of the respective second set of conductive features within the respective mounting hole and a conductive metal mounting pad formed on the exterior module surface surrounding the respective mounting hole, and the metal mounting pad can be continuous with the conductive metal layer on the interior surface of the respective mounting hole and providing an electrical contact on the exterior module surface connected to the exposed respective portions of the respective second set of the conductive features. The metal mounting pad can further include a conductive metal shield covering a at least 25 percent of the exterior module surface. The conductive shield can cover at least 50 percent of the exterior module surface and connect a plurality of the mounting holes. The mounting holes can extend completely through the electronic module. The electronic module can further include a second set of electronic components mounted to a second surface of the PCB, a second layer of cured encapsulant can cover the second set of components and the second surface of the PCB, and the second layer of cured encapsulant can form a second exterior module surface.

The apparatus can further include a conductive metal layer formed on an interior surface of each of selected terminal holes in contact with the respective portions of the respective set of conductive features within the respective terminal hole. The selected set of conductive features can include one or more of the conductive layers of the PCB, each selected terminal hole can be formed through at least a portion of the PCB, and the respective portions of the one or more conductive features can include edges of the one or more conductive layers. The apparatus can further include a conductive metal pad formed on the first exterior module surface surrounding one or more of the selected terminal holes, and the metal pad can be continuous with the conductive metal layer on the interior surface of the one or more of the selected terminal holes and provide an electrical contact on the first exterior module surface connected to the one or more exposed features within the respective terminal hole. The apparatus can further include a solder connection between a portion of the conductive terminal and the conductive metal layer on the interior surface of the one or more selected terminal holes. The apparatus can further include a solder connection between a portion of the conductive terminal and the conductive metal pad.

The apparatus can further include one or more mounting holes formed in the first and second layers of cured encapsulant and PCB, each mounting hole can extend completely through the module and intersect a respective second set of the conductive features to expose respective portions of the respective second set of conductive features in the respective mounting hole. Each mounting hole can have a conductive metal layer formed on an interior surface of the respective mounting hole in contact with the exposed respective portions of the respective second set of conductive features within the respective mounting hole and a conductive metal mounting pad formed on one or both of the first and second exterior module surfaces surrounding the respective mounting hole, and the metal mounting pad can be continuous with the conductive metal layer on the interior surface of the respective mounting hole and provide an electrical contact on the exterior module surface connected to the exposed respective portions of the respective second set of the conductive features. The metal mounting pad can further include a conductive metal shield covering a at least 25 percent of one or both of the first and second exterior module surfaces. The conductive shield can cover at least 50 percent of both of the first and second exterior module surfaces and electrically connect to a plurality of the mounting holes. The selected set of conductive features can include a conductive trace on a surface of the PCB, each selected terminal hole can be limited in depth to the surface of the PCB, and the respective portions of the one or more conductive features can include a surface of the conductive trace at a bottom of each terminal hole.

In another general aspect, a method of forming modular circuit assemblies is provided. The method includes: assembling an encapsulated panel including a multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each module having perimeter boundaries defined by one or more predetermined cut lines and one or more conductive features buried beneath the first exterior surface; selectively forming a plurality of terminal holes in the first exterior surface of the panel through the first layer at predetermined locations within the perimeter boundaries of each electronic module, each terminal hole being spaced apart from the cut lines and exposing within the hole a respective conductive feature; selectively forming one or more conductive metal layers on the first exterior surface of the panel including within the plurality of terminal holes, the one or more conductive metal layers within each terminal hole being in electrical contact with the respective conductive feature; patterning the one or more conductive metal layers on the exterior surface, to form a plurality of electrical contacts on the exterior surface of the panel electrically isolated from at least one other electrical contact in the plurality of electrical contacts; and cutting the panel along the one or more cut lines to singulate the plurality of electronic modules, each singulated electronic module having a respective plurality of the electrical contacts formed on the exterior surface of the module.

Implementations of the aspect can include one or more of the following features. The method can further include selectively dispensing solder to each of the terminal holes, at least partially filling each terminal hole with solder. The method can further include applying a compressive force to the dispensed solder to establish a predetermined uniform height relative to the first exterior surface. The method can further include selectively dispensing a curable compound to each of the of terminal holes, at least partially filling each terminal hole with the curable compound, curing the compound; and selectively dispensing solder to each of the terminal holes, at least partially further filling each terminal hole with solder. The method can further include applying a compressive force to the dispensed solder to establish a predetermined uniform height relative to the first exterior surface. Selectively forming a plurality of terminal holes can further include using a laser; the respective conductive feature can include a conductive trace on the first surface of the PCB; the laser can include a wavelength that removes encapsulant at a rate that is at least an order of magnitude greater than a rate at which material would be removed from the conductive trace; and the plurality of terminal holes can be formed at a depth that is limited by the respective conductive trace on the surface of the PCB.

BRIEF DESCRIPTION OF DRAWINGS

Like reference numbers and symbols in the various drawings indicate like elements.

DETAILED DESCRIPTION

Figure 1:
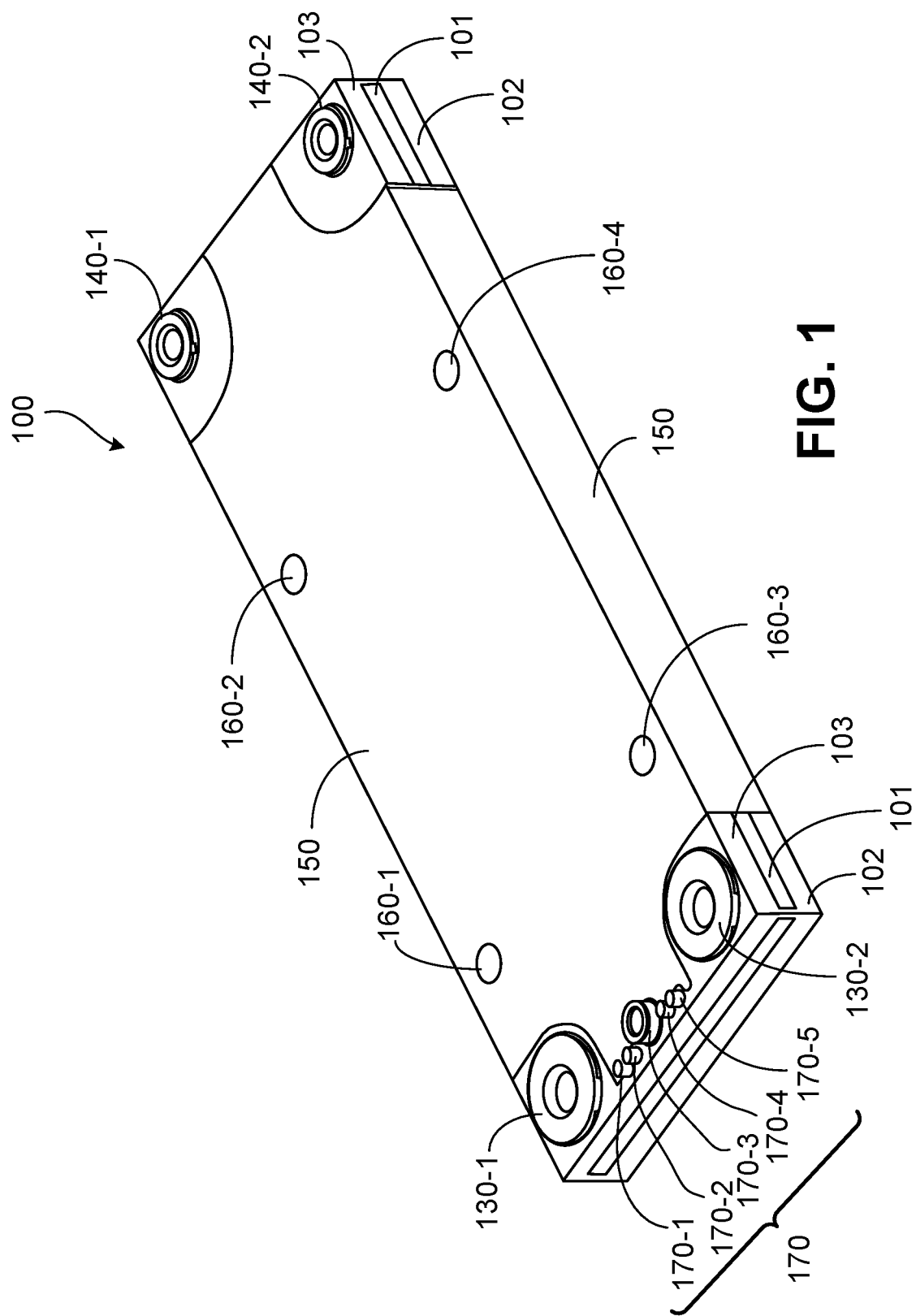
FIG. 1 shows an isometric view of an electronic module.

An encapsulated electronic module, such as an electronic power converter module for example, may comprise a printed circuit assembly over-molded with an encapsulant to form some or all of the package and exterior structure or surfaces of the module. In the case of an electronic power converter module, the printed circuit assembly may include one or more inductive components, such as inductors and transformers. Encapsulated electronic power converters capable of being surface mount soldered to a customer motherboard are described in Vinciarelli et al., Power Converter Package and Thermal Management, U.S. Pat. No. 7,361,844, issued Apr. 22, 2008, (the "SAC Package Patent") (assigned to VLT, Inc. of Andover, Mass., the entire disclosure of which is incorporated herein by reference). Encapsulated electronic modules having at least one surface of a magnetic core structure exposed and methods for manufacturing the same are described in Vinciarelli et al., Encapsulation Method and Apparatus for Electronic Modules, U.S. Pat. No. 8,427,269 issued Apr. 23, 2013, (the "Exposed Core Patent") (assigned to VI Chip Inc. of Andover, Mass., the entire disclosure of which is incorporated herein by reference). Methods of making encapsulated multi-cell power converters and interconnection modules are described in Vinciarelli, Delivering Power to Semiconductor Loads, U.S. patent application Ser. No. 16/218,418, filed Dec. 12, 2018, (the "Gearbox Disclosure") (assigned to VLT, Inc. of Andover, Mass., the entire disclosure of which is incorporated herein by reference).

Methods of over-molding both sides of a printed circuit board assembly while leaving opposing regions on both sides of the printed circuit board free of encapsulant are described in Saxelby, et al., Circuit Encapsulation Process, U.S. Pat. No. 5,728,600, issued Mar. 17, 1998 and Saxelby, et al., Circuit Encapsulation, U.S. Pat. No. 6,403,009, issued Jun. 11, 2002 (collectively the "Molding Patents") (both assigned to VLT, Inc. of Andover, Mass. and incorporated by reference in their entirety).

Encapsulation of multiple electronic assemblies as panels followed by singulation into individual modules and forming electrical contacts, e.g. "bar codes," along vertical edges of individual modules, e.g. during singulation from the panel, for establishing electrical connections to the circuitry inside each module are described in Vinciarelli et al., Panel-Molded Electronic Assemblies, U.S. Pat. No. 8,966,747, issued on Mar. 3, 2015 (the "Bar Code Patent"); and in Vinciarelli et al., Panel-Molded Electronic Assemblies, U.S. Pat. No. 9,402,319, issued on Jul. 26, 2016 (the "PM CIP"); enhanced three-dimensional contacts for establishing robust solder connections to the bar codes is described in Vinciarelli et al., Electronic Assemblies Having Components With Edge Connectors, U.S. patent application Ser. No. 14/596,914, filed on Jan. 14, 2015 (the "3D Bar Code Application"); encapsulation of multiple electronic assemblies as a panel, and forming electrical contacts on multiple faces of each electronic assembly, including vertical and horizontal faces, prior to singulation of the panel into modules, is described in Vinciarelli et al., Panel Molded Electronic Assemblies With Multi-Surface Conductive Contacts, U.S. patent application Ser. No. 14/731,287, filed on Jun. 4, 2015 (the "Multi-Surface Application"); collectively the "Panel Mold Disclosures" (all of which are assigned to VLT, Inc. of Andover, Mass., and are incorporated in their entirety herein by reference). The Panel Mold Disclosures describe processes for making pluralities of electronic modules in encapsulated panels, which may have interconnection features buried within the encapsulated panel, e.g. in a PCB encapsulated within the panel, and which are subsequently singulated into individual electronic modules.

I. Terminal Inserts

Referring to FIG. 1, an electronic module 100 is shown having a plurality of electrical terminals, e.g. 130-1, 130-2, 140-1, 140-2, and 170. The electric terminals can be made of, e.g., electrically conductive metal. The electronic module includes a printed circuit board 101 ("PCB") (which can be, e.g., a multilayer printed circuit board) disposed between cured layers of encapsulant 102 and 103. The PCB 101 may have electronic components, and conductive runs or traces and other conductive features, mounted to its surfaces and enclosed within the encapsulant layers. The PCB 101 may have one or more conductive layers disposed within the PCB 101, such that portions of the conductive layers are not exposed until holes are formed in the PCB 101 to expose the portions of the conductive layers. The terminals, which may extend into, but preferably not all the way through, the module 100 provide means for making external connections to circuitry on the encapsulated PCB 101. As shown in FIG. 1, relatively large electrical contacts, e.g. contacts 130-1, 130-2, 140-1, 140-2 (each of which may include a threaded hole to receive a threaded fastener, such as a screw, see, e.g. screws 970-1, 970-2, 970-3, 970-4 in FIG. 17) provide relatively higher current carrying capacity, making them amenable for use as power connections. In the power converter example shown, contacts 140-1 and 140-2 may, e.g., be used for input power connections, and contacts 130-1 and 130-2 may, e.g., be used for output power connections. A plurality of smaller terminals 170, having relatively smaller interconnect area and lower current carrying capacity, may be provided for low current inputs or outputs or for signal connections, such as control and communication signals.

Additionally, as shown in FIG. 1, portions of the outer surfaces of the encapsulant layers 102, 103 and the edges of PCB 101 (optionally including areas covering magnetic cores (not shown), as described e.g., in the Exposed Core patent), may be coated with an electrically (and thermally) conductive shield 150. The shield 150, which may, e.g. be made of copper, may serve one or more functions, e.g. provide a grounding surface and/or an electromagnetic shield (e.g. for EMI reduction), improve heat distribution over the large surfaces of the module (e.g. provide isothermal planes), improve thermal coupling to the module (e.g. by conducting heat through a mounting board or substrate), and/or provide solder-mount options. Additionally, the plated conductive layer may slow moisture absorption by the encapsulant (e.g., 102, 103), protect magnetic cores, and help control leakage inductance in internal transformers.

The shield 150 may optionally make electrical connection to edges of the PCB along the perimeter of the module, i.e. along the cut lines, using the bar code techniques described in the Panel Mold Disclosures, e.g. using the techniques described in the Multi-Surface Application. However, the shield may instead, or additionally, be electrically connected to conductive traces in the PCB 101 via the apertures 160-1, 160-2, 160-3, 160-4, using the process described below. Of course, the electrical shield 150 need not make electrical connection to internal circuitry, or to the PCB 101 at all, remaining electrically isolated. As also shown in FIG. 1, the module 100 may comprise apertures, e.g. apertures 160-1, 160-2, 160-3, 160-4, which may preferably extend all the way through the module, which may for example provide holes for mounting the module to a larger assembly. The apertures 160-1, 160-2, 160-3, and 160-4 may additionally be used for electrical connections, e.g. a ground or common terminal, and facilitate heat removal by mounting the module to a cold plate, heat sink, or other heat removal device.

A. Panel Preparation

A process for making the electronic modules 100, illustrated in FIGS. 3 through 6 builds upon the panel molding processes described in the Panel Mold Disclosures focusing on making terminals 130, 140, 170 and apertures 160. In the example of FIGS. 3-6, the encapsulated panel 190 comprises four un-singulated electronic modules 100A, 100B, 100C, 100D, which when finished will include a conductive shield 150 connected to the edges of the PCB 101. Note that the electrical terminals, e.g. 130-1, 130-2, 140-1, 140-2, and 170 (FIG. 1) may be formed in module 100 with or without the optional electrical connections, e.g. to the shield 150, to the edges of the PCB 101 along the cut lines.

The following process description starts from just after the PCB panel is encapsulated as described in the Multi-Surface Application. The encapsulated panel 190 which is partially shown in the example of FIGS. 3 through 6 comprises four un-singulated electronic modules. (See also, encapsulated panel 890 shown in FIGS. 43-44 of the PM CIP and panel 102-1 in FIGS. 4-9 of the Multi-Surface Application.) Note that the panels in the Panel Mold Disclosures (which are assumed to be the same size as in the present example) are shown comprising a larger number of un-singulated electronic modules 100, reflecting the dependency on module size, e.g. the relatively larger modules 100 in FIGS. 3-6, results in fewer modules per panel.

Figure 3:
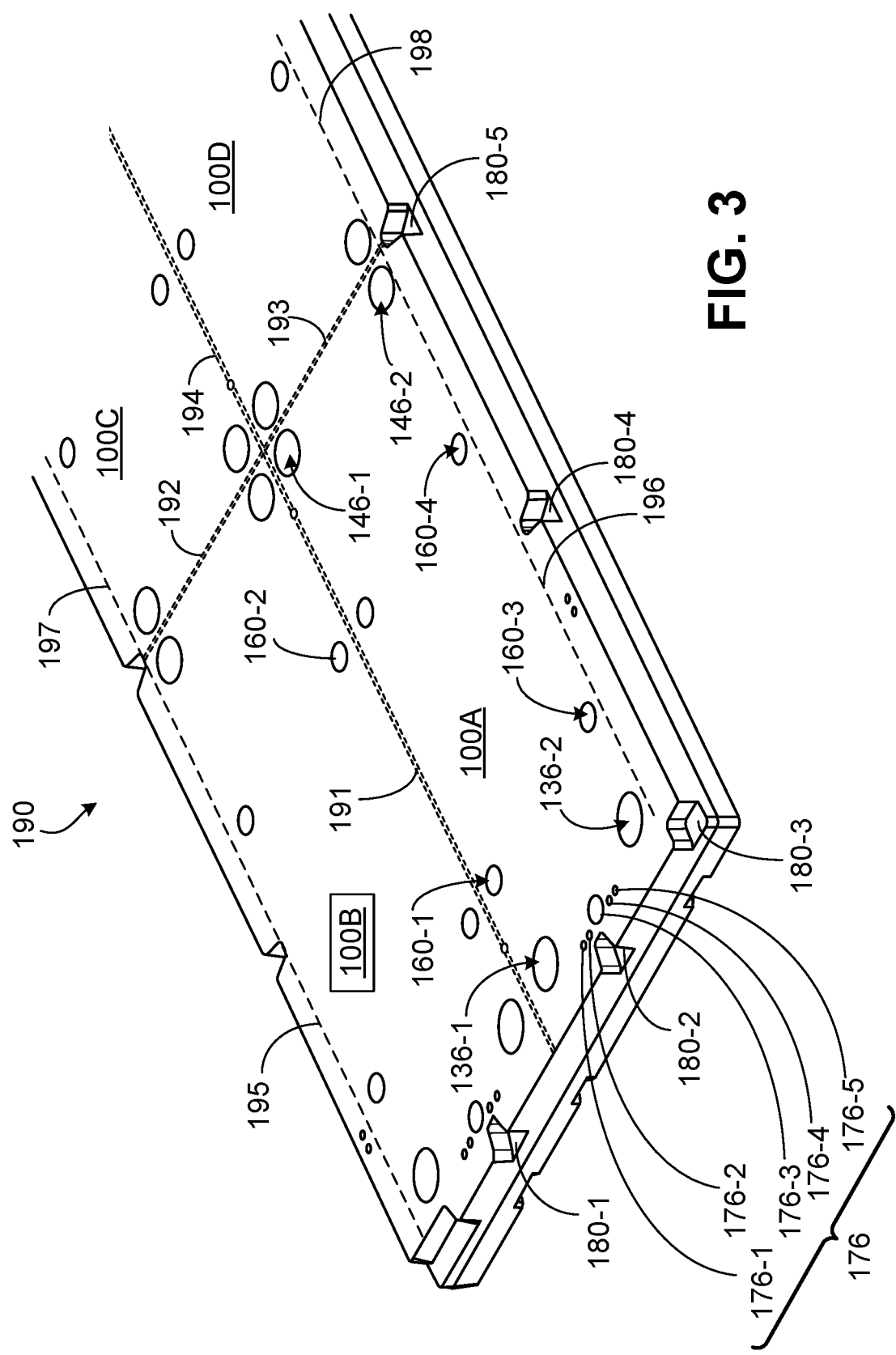
FIG. 3 shows an isometric view of an encapsulated panel comprising several electronic modules included in regions defined by cut lines.
Figure 4:
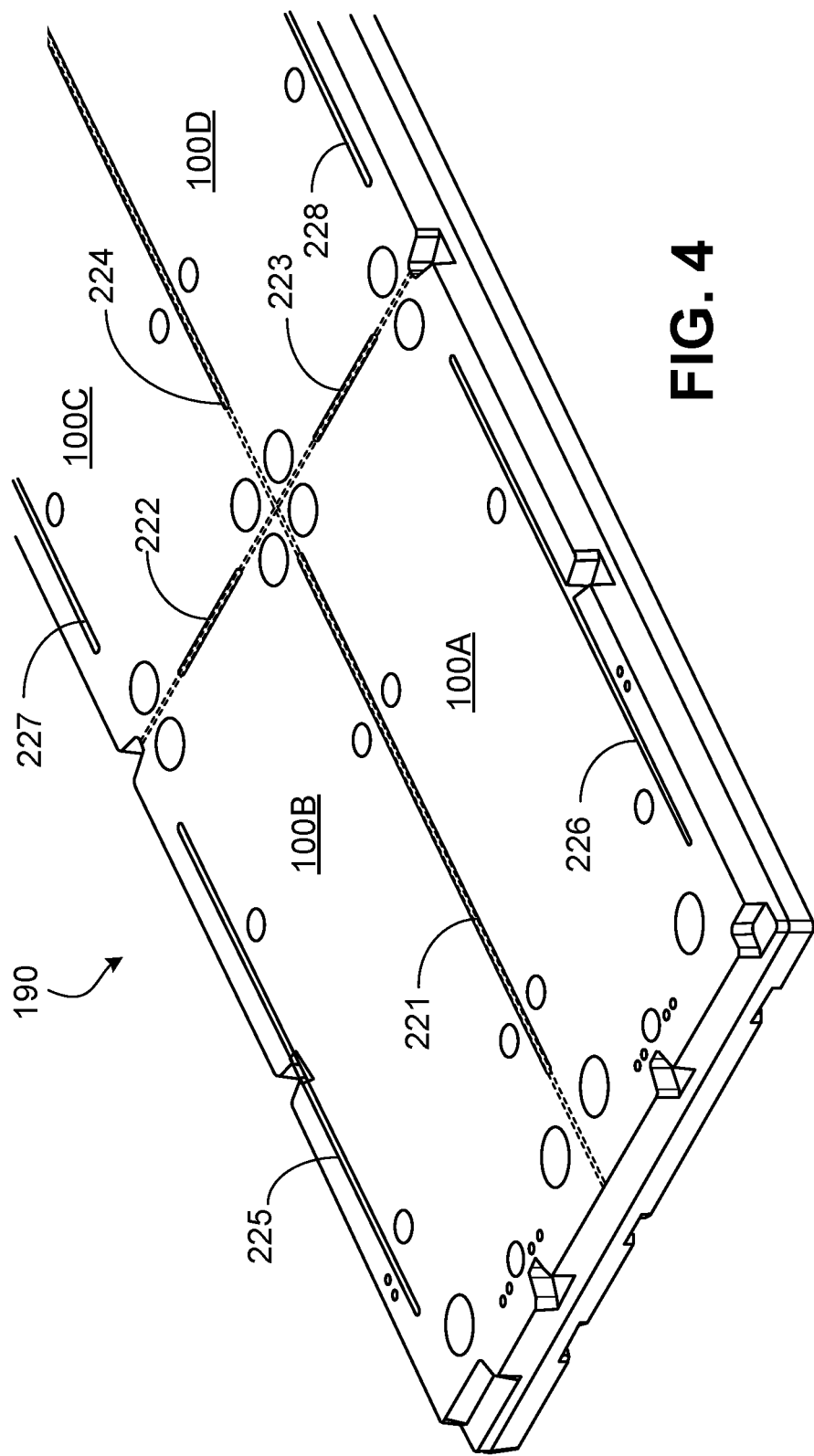
FIG. 4 shows the panel of FIG. 3 comprising slots cut along the cut lines.

As shown in FIG. 3, the panel 190 is shown with several cut lines 191 through 198 representing the edges of a plurality of un-singulated modules, 100A, 100B, 100C, 100D: cut lines 191, 192, 193, 194 representing boundaries between adjacent modules and cut lines 195, 196, 197, and 198 representing the boundaries between modules and scrap material. Electronic components and conductive features associated with each module are included within the respective cut lines defining the boundaries of the module. The modules 100A-100D remain integral parts of the encapsulated panel 190 until separated from the panel by singulation cuts. Also shown in FIG. 3 are exposed, e.g. non-encapsulated, areas e.g. features 180-1, 180-2, 180-3, 180-4, 180-5, of the surface of PCB 101 that may be provided to locate reference holes or fiducials for alignment or identification of the panel during manufacture. (See col. 30, ln. 24-col. 30, ln. 46 in the PM CIP).

Holes, including blind holes and through holes, may be formed in the encapsulated panel 190 to establish the locations of the terminals and apertures. (As used herein, a blind hole refers to a hole that extends partially into, but not completely through, the panel; and a through hole refers to a hole that extends completely through the panel.) For example, FIG. 3 shows blind holes 136-1, 136-2, 146-1, 146-2 and 176 (e.g. 176-1, 176-2, 176-3, 176-4, 176-5) and through holes 160-1, 160-2, 160-3 and 160-4 formed in un-singulated module 100A, corresponding to the locations of terminals 130-1, 130-2, 140-1, 140-2 and 170 (i.e. 170-1, 170-2, 170-3, 170-4, 170-5) and apertures 160-1, 160-2, 160-3 and 160-4 shown in FIG. 1. Corresponding holes (not labeled) are shown formed at corresponding locations on the other modules 100B, 100C, 100D on the panel 190. The mounting holes, e.g. 160-1, 160-2, 160-3, 160-4, preferably may be formed as through holes, which extend completely through the module, allow mounting hardware to pass through the module; while the holes, e.g. 136-1, 136-2, 146-1, 146-2 and 176, for the terminals, e.g. 130-1, 130-2, 140-1, 140-2 and 170 (i.e. 170-1, 170-2, 170-3, 170-4, 170-5), may be blind holes providing electrical isolation between each terminal and the shielding or mounting surfaces on the opposite side of the module, e.g. chassis, cold plate, heat sink or other heat removal structure without the need for added insulation.

Figure 7A:
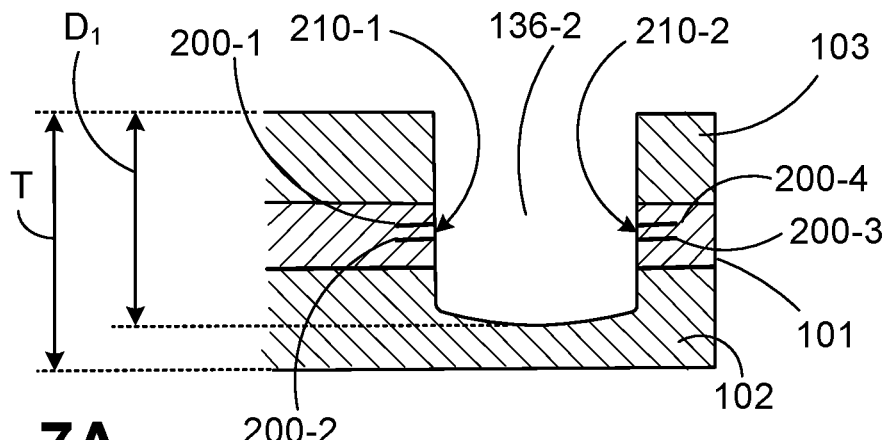
FIG. 7A shows a cross section of a terminal hole in an electronic module that passes entirely through an internal substrate.

Holes 136-1, 136-2, 146-1, 146-2 and 176 (for the terminals) each may therefore be preferably formed to extend partially through the thickness of the module to expose conductive features buried within the module for making electrical connections from one side of the module, but not extend so far as would require insulation on the opposite side; and more preferably, extend only as deep as required to expose the conductive features necessary for each terminal. Referring to FIG. 7A, which shows a cross-section though module 100A at the center of blind hole 136-2, shows the depth of the blind hole, $D_1$, (FIG. 7A) extending all the way through encapsulant layer 103, all the way through PCB 101, and into but not through, e.g. part of the way through, encapsulation layer 102, i.e. the depth, $D_1$, is less than the thickness, T of the module. As shown blind hole 136-2 is preferably formed to expose conductive features buried in the module. As shown in FIG. 7A, the hole may be formed to pass through the conductive features, e.g. conductive features 200-1, 200-2, 200-3, 200-4, representing traces in layers of the multilayer PCB 101, exposing one or more layers of conductive traces on the inner surfaces (e.g. surfaces 210-1, 210-2) of the hole 136-2. As shown in FIG. 7A, the hole passes through conductive traces located in more than one of the conductive PCB layers producing conductive rings in the wall of the hole 136-2, akin to the bar code terminations described in the PM CIP, Bar Code Patent, and Multi-Surface Application.

A more detailed description of buried interconnects and bar codes may be found in the PM CIP at col. 17, ln. 36-col. 19, ln. 14, in the Bar Code Patent at col. 15, ln. 40-col. 17, ln. 2; and at paragraphs 036 and 037 of the Multi-Surface Application. The bar codes described in the PM CIP, Bar Code Patent, and Multi-Surface Application may be formed primarily along module boundaries and exposed during singulation in the PM CIP and Bar Code Patent or before singulation in the Multi-Surface Application. The bar codes in the Multi-Surface Application are exposed in a similar fashion, e.g. by forming holes to expose the buried conductive features; however, the process in the present disclosure forms the holes and exposes the conductive features in areas of the module that may not include the cut lines, i.e. are located completely within the boundaries of each individual module, rather than along the boundary, and preferably result in one or more conductive rings in the side walls of the holes (which are undisturbed by singulation). The conductive features exposed by forming the holes may preferably result in conductive rings embedded in the inner surface of the holes, however, they need not. For example, the conductive rings are formed when the hole passes through a horizontal conductive layer that completely surrounds the hole. For conductive features that are not horizontal relative to the vertical axis of the hole or that may not completely surround the hole, the shape of the conductive feature exposed in the inner surface of the hole, i.e. the hole wall, may differ. For example, a hole may pass through only a portion of a conductive feature such as a puck on the surface of, or a conductive layer in, the PCB 101, so the conductive feature may not be present in the entire circumference of the hole, thus not appearing as a ring. For simplicity the following description will refer to the conductive features exposed in the holes as "conductive rings" consistent with the embodiment having holes that penetrate the PCB, but the term should be understood to refer generally to any conductive feature exposed by forming the hole. For example, the conductive rings can have a circular shape, an elliptical shape, a star shape, or any other shape of the hole. The conductive rings may not completely surround the hole and may not be horizontal relative to the vertical axis of the hole. In some examples, the conductive features exposed in the holes are considered to be edges of the conductive layers. In the case of a conductive puck on a surface of the PCB, the exposed feature may appear as a single conductive sleeve in the hole.

Figure 7B:
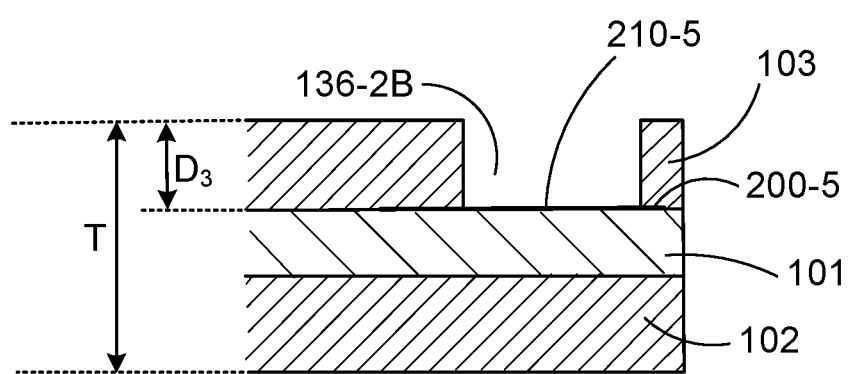
FIG. 7B shows a cross section of a terminal hole in an electronic module that does not penetrate an internal substrate.
Figure 7C:
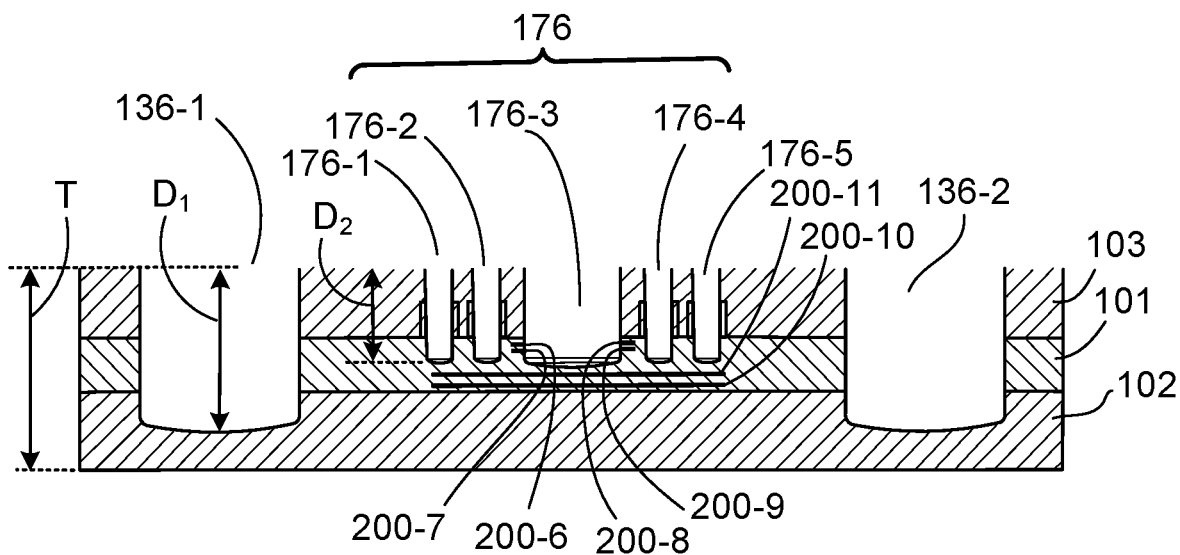
FIG. 7C shows a cross section of terminal holes in an electronic module that pass partially and completely through an internal substrate.

The cross section through the centers of blind holes 176 in FIG. 7C, shows the depth, $D_2$, of the holes 176 relative to the PCB 101 and encapsulation layers 102, 103. As shown blind holes 176 extend completely through encapsulant layer 103, partially into but not completely through PCB 101, and not at all into encapsulation layer 102. Controlling the depth, e.g. depth $D_2$, during formation of the blind holes, e.g. holes 176, allows selective exposure of buried conductive features, e.g. conductive PCB traces exposed as one or more conductive rings on the inner surface of the hole and greater utilization of other layers of the PCB. For example, conductive traces 200-6, 200-7, 200-8 and 200-9 are shown exposed in blind hole 176-3 while conductive traces 200-10, 200-11 are not exposed in FIG. 7C.

Alternatively, blind holes may be formed to avoid penetrating the internal substrate in the panel. Referring to FIG. 7B, the depth, D3, of the holes, e.g. hole 136-2B, is shown avoiding penetration of the PCB 101. As shown, hole 136-2B extends to the surface of the PCB 101, which in the example shown, exposes a conductive feature 200-5 at the bottom of the hole. In this variation, the conductive feature may appear as an essentially flat conductive surface at the bottom of the hole having a perimeter that essentially matches that of the hole. For convenience, the term "conductive plate" will be used herein to refer to the conductive features 210-5 exposed at the bottom of blind holes that do not penetrate the PCB 101 irrespective of the shape of the hole. A laser may be particularly adept at forming holes of the type shown in FIG. 7B, where the wavelength of the laser may be chosen to selectively remove the encapsulant, e.g. encapsulant 103, at an efficient rate, but does not significantly remove conductive features, e.g. copper traces on the surface of the PCB 101, or conductive features mounted to the surface of the PCB 101, in which case the conductive feature to be exposed may be used to control the depth of the hole. For example, the laser wavelength may be chosen to provide a removal rate of encapsulant that is one or more orders of magnitude greater than the removal rate of copper. Laser drilling may be preferable over mechanical drilling for the precision of the hole depth which may be controlled by the conductive feature. Additionally non-circular holes may be more easily formed with the laser compared to a mechanical drill or router. For example, oval slots and other hole shapes are easily formed with the laser, e.g. non-circular holes may provide venting during soldering, e.g. allowing use of simpler terminals, i.e. without ridges along the shank, to save cost, and may resist rotation of the terminals, i.e. to provide improved mechanical integrity; or be shaped to facilitate plating processes, e.g. to improve metal deposition in the holes.

Optionally, electrically conductive features may be mounted to the PCB 101, e.g. on one or both surfaces of the PCB 101, remain buried within the encapsulated panel, and exposed by forming the holes 176; with the advantage of increasing the exposed area of the conductive rings for holes that penetrate the conductive feature or the performance of the conductive plate or to provide a buffer for laser drilled holes in the FIG. 7B variation.

By limiting the depth, D, of holes to be less than the thickness, T, of the module (e.g., $D_1<T, D_2<T, D_3<T$) no part of the terminals (e.g. terminals 130) are exposed at the outer surface of encapsulation layer 102. This may provide enhanced insulation and safety and make the outer surfaces of layer 102 adjacent to the holes available for plating with shields or other conductive patterns. Partial depth holes may also result in better mechanical support for terminals.

Optionally, electrical connections to the PCB 101 along the perimeter of the individual modules, e.g. module 100 (FIG. 1) may be established using the process descried in the Multi-Surface Application. For example, the shield 150 shown in FIG. 1 may be electrically connected to the PCB along one or more of the four edges of the module using the Multi-Surface process. Accordingly in FIG. 4, panel 190 (which comprises four un-singulated electronic modules) is shown having optional slots, e.g. slots 221 through 228, formed in the panel, e.g. cut all the way through the panel as described in the Multi-Surface Application, along the cut lines 191-198 to establish electrical connections at the edges of the PCB 101. Cutting of slots of this kind may be done using, e.g. a water jet as described in the Multi-Surface Application at paragraph 38. The connections formed along the module perimeter, via the slots, may be used in addition to electrical connections formed via the holes 160, e.g. to improve electrical performance. Of course, connections along the perimeter of the module may be omitted in which case forming the slots before plating also may be omitted.

Figure 5:
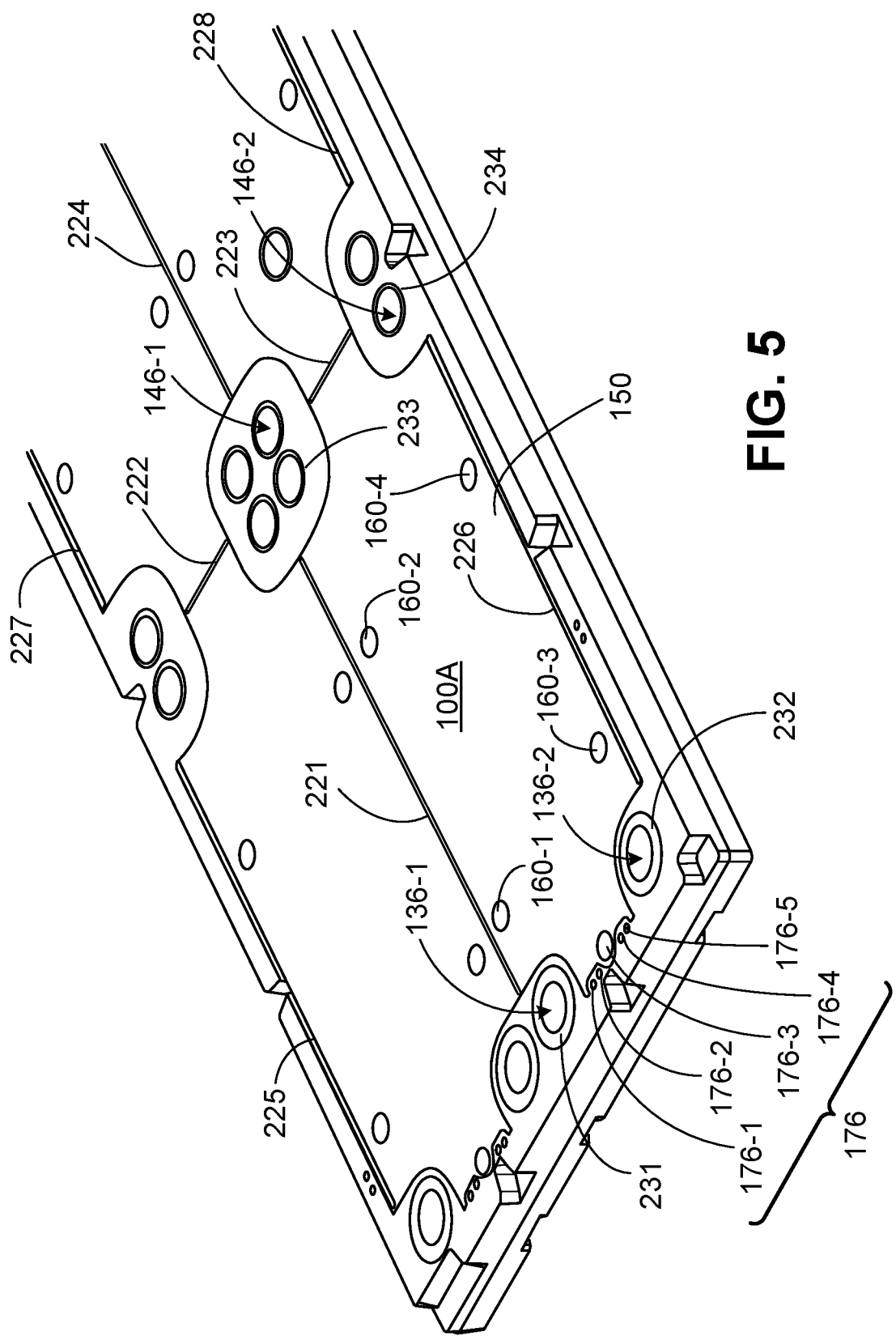
FIG. 5 shows the panel of FIG. 4 after metallization.

FIG. 5 shows the panel 190 after a conductive layer has been formed, e.g. by plating, on selected surfaces of the module, including the surfaces within slots 221 through 228, and patterned as described in the Multi-Surface Application. The conductive layer 150 in FIG. 5, corresponding to conductive shield 150 in FIG. 1, may as shown provide a continuous conductive shield covering the outer surfaces of the encapsulant layers 102, 103 and the sides of the modules exposed within the slots 221, 223, 226. Alternatively, the shield may be patterned to cover select portions of the surfaces as desired, e.g. the shield 150 may preferably cover at least 25 percent, or 50 percent or more of the module surfaces.

Preferably, the process of forming the conductive layer deposits conductive material inside of the exposed holes and optional slots, e.g. blind holes 136-1, 135-2, 146-1, 146-2 and 176, through-holes 160-1, 160-2, 160-3 and 160-4; and on the exposed surfaces of the panel, e.g. in regions 231, 232, 233, and 234 on the module surface, adjacent to the holes providing a conductive layer around each hole, i.e. a conductive pad. Plating within the holes may form a conductive connection to the conductive bar code pattern(s) or conductive plate(s) on the inner surfaces of the holes and slots. A variety of processes for providing conductive material on panel surfaces and in the slots and holes, e.g. using plating processes which may include masking, deposition of a seed layer, and electroless or electrolytic plating of copper, are described in paragraphs 40-48 in the Multi-Surface Application. As shown, the conductive layer is patterned to provide conductive material on the surface surrounding each hole that preferably extends into the hole making electrical contact with the exposed conductive features, e.g. conductive rings or conductive plate in the hole. The through-holes, 160-1, 160-2, 160-3 and 160-4, in the example of FIG. 5 may be formed, as shown, in the area in which the conductive shield is to be formed, and the conductive layers formed on the exposed interior surfaces of the through-holes can be connected to the conductive shield, which may additionally be connected to either bar codes along the module perimeter edge as shown, conductive rings within each through-hole, or both. Alternatively, one or more through holes may be electrically isolated from the shield by appropriate patterning of the shield in the manner shown for the blind-holes 136 in FIG. 5.

Figure 6:
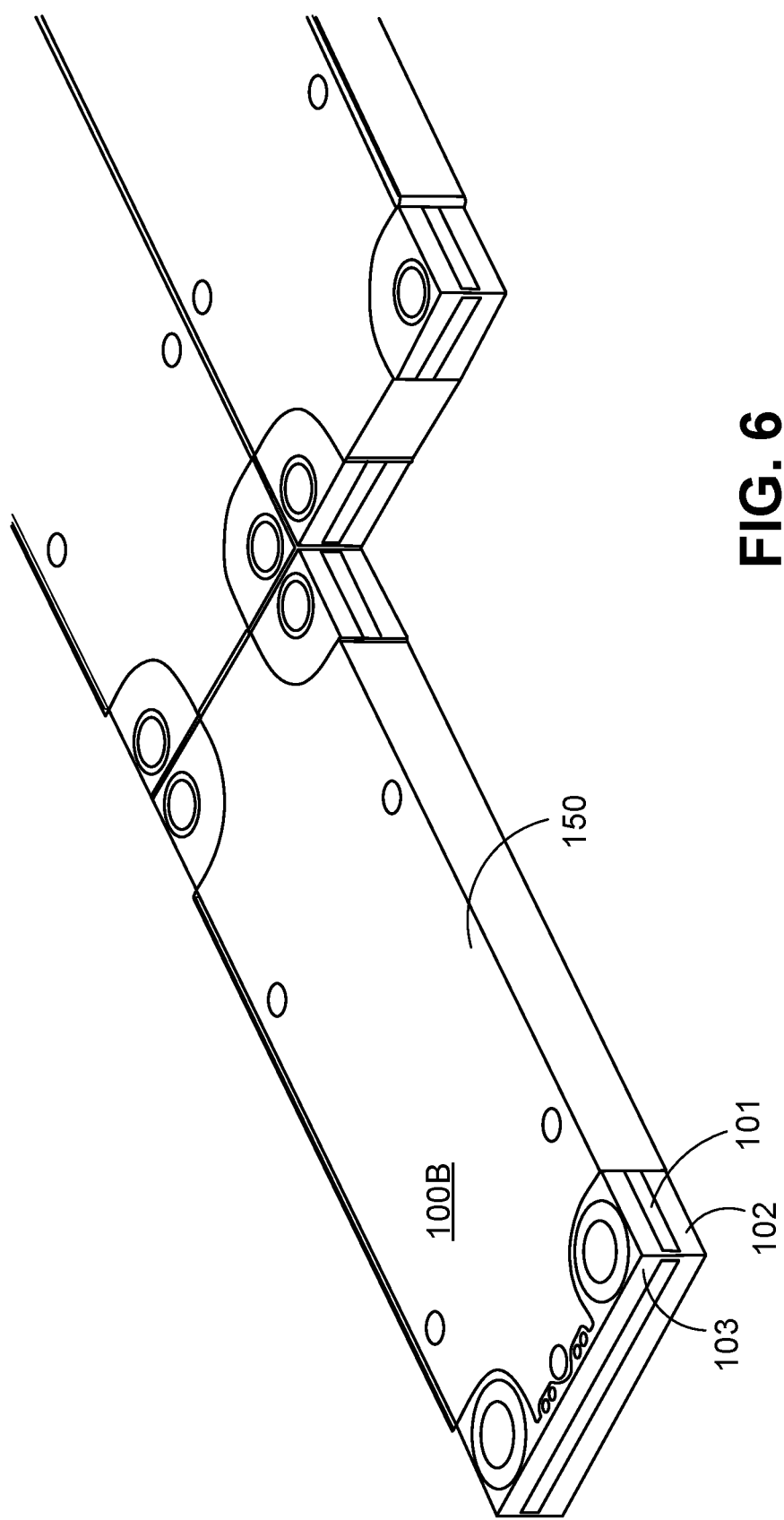
FIG. 6 shows a portion of the panel of FIG. 5 after singulation.

FIG. 6 shows a portion of the panel 190 after the singulation cuts have been made, dividing the panel into individual modules. Singulation methods, which may include cutting along cut lines (e.g. cut lines 191-198, FIG. 3) within the slots (e.g. slots 221-228, FIGS. 4 and 5) using a thin saw, e.g. 0.012" blade, are described at col. 17, lns. 7-34, in the PM CIP and paragraph 49 in the Multi-Surface Application. Because the plating step provided plating within the slots, a continuous shield 150 may be formed on multiple surfaces of the modules, as shown in FIGS. 1 and 6. Exposing bar codes along the perimeter edge of the module for making electrical connection to the conductive shield, which is not necessary for the present embodiment, may be supplanted or augmented with connections formed within the through-holes. For example, the slots along the perimeter edges of the modules (e.g. slots 221-228, FIGS. 4 and 5) may be omitted completely, in which case the conductive shield may be absent from the vertical edges of the singulated modules and may be patterned to include a setback from the vertical edges if desired.

B. Terminal Assembly

Figure 2:
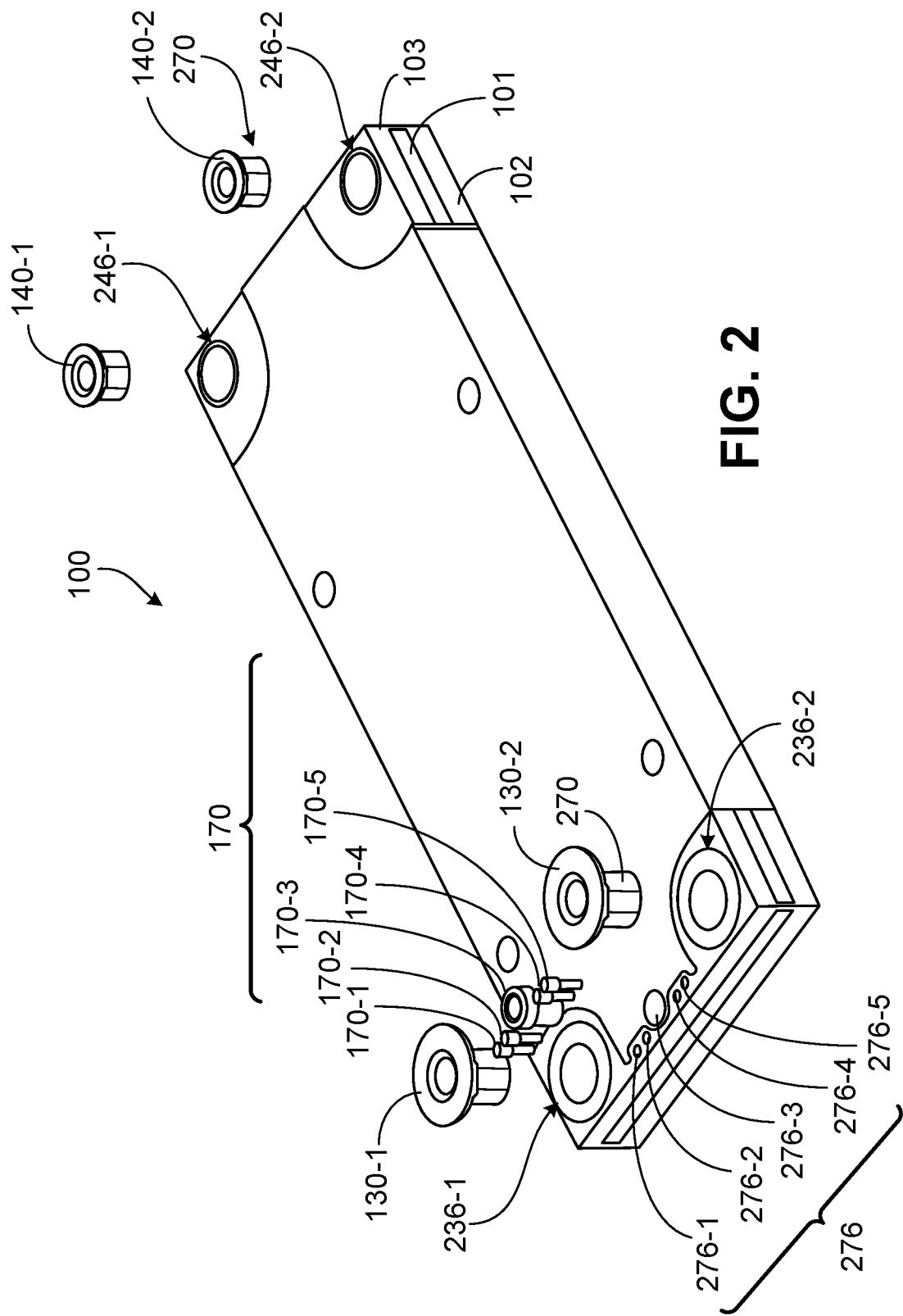
FIG. 2 is an exploded view showing terminals prior to insertion in plated holes.

The terminals may be assembled to the module before or after singulation, each approach having its own advantages and disadvantages. For example, terminal assembly before singulation may be advantageous for standardized panel handling equipment but would present cleaning challenges following singulation. Conversely, terminal assembly following singulation avoids subjecting the terminals to singulation residue in the terminals which may be preferable even with potential module-specific assembly challenges. Referring to FIG. 2, an exploded view of a module 100 is shown with terminals 130-1, 130-2, 140-1, 140-2 and 170 prior to insertion into and assembly with their respective plated holes 236-1, 236-2, 246-1, 246-2 and 276. Terminals may be secured within their respective holes in a variety of ways, including, e.g., soldering or press-fitting, and the configuration of the portion of a terminal that is inserted into a hole may be adapted as desired according to the function, configuration and size of the terminal and the method of insertion.

Figure 8A:
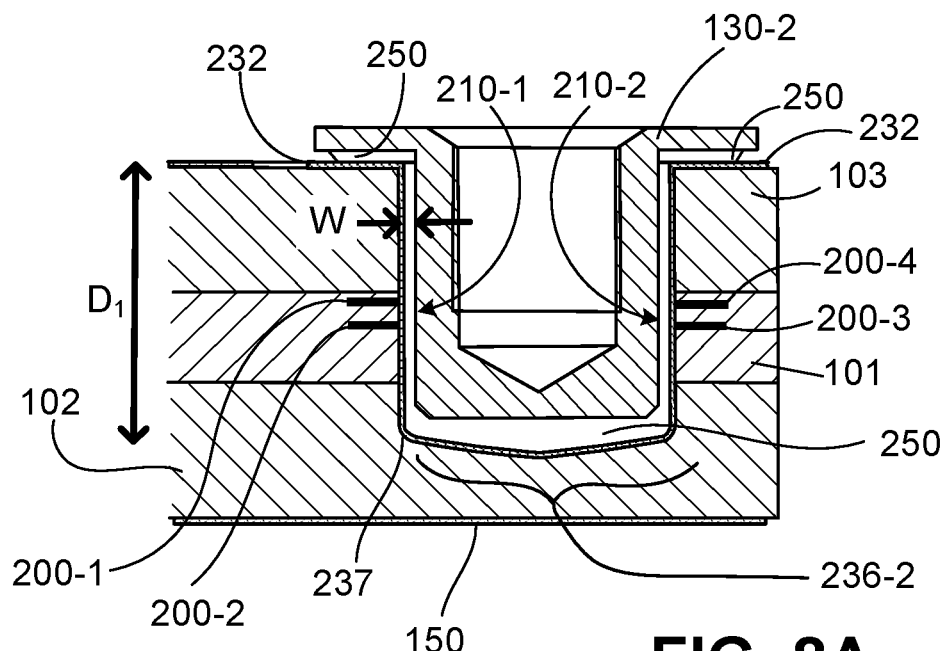
FIGS. 8A and 8B are cross-sectional views of a terminal soldered into a plated hole.

Referring to FIG. 8A which shows a detailed cross-sectional view of terminal 130-2 assembled with a respective PCB-penetrating plated hole 236-2 (FIGS. 7A, 7C). As shown, conductive plating 237 on the inside surface of the hole 236-2 is electrically connected to the conductive rings, i.e. the exposed conductive layers of PCB 101 (e.g. conductive layers 200-1 through 200-4). As shown, the region between the interior plated surface of the plated hole 236-2 and the exterior surface of the terminal 130-2 within the hole may be filled with solder 250 to form a robust electrical and mechanical connection. To allow gases to escape from the hole during the soldering process, the terminal 130-2 may include contours to provide clearance between the terminal 130-2 and the interior surface of the hole (e.g. dimension W, FIG. 8A). For example, FIG. 2 shows terminals 130-1, 130-2, 140-1, 140-2, having an approximately octagonal shape, which provides gaps between the flat surfaces 270 of the terminal and the circular walls of the hole. Other contours, shapes, or indentations may be provided to allow gases to escape from the holes during soldering.

Figure 8B:
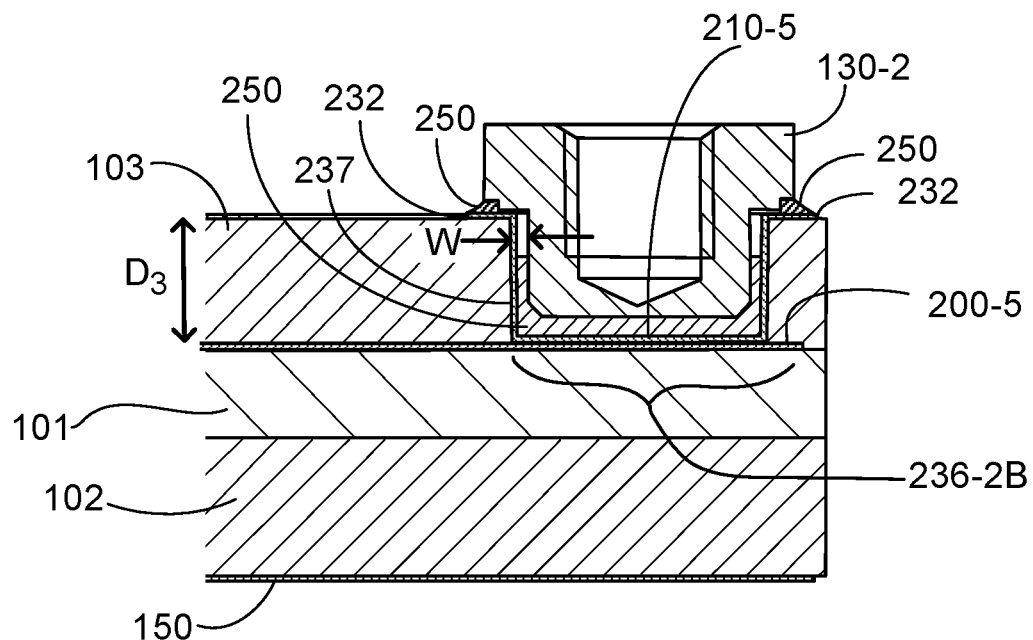

Referring to FIG. 8B, a cross-sectional view of terminal 130-2 assembled with a respective non-PCB penetrating plated hole 236-2B is shown with conductive plating 237 on the inside surface of the hole 236-2B. The conductive plating 237 in the embodiment shown in FIG. 8B is electrically connected to the exposed metal layer on the surface of the PCB 101, i.e. the exposed top conductive layer of PCB 101 (e.g. conductive layer 200-5). Similar to the embodiment of FIG. 8A, the region between the surface of conductive layer 237 in the plated hole 236-2B and the exterior surface of the terminal 130-2 within the hole may be filled with solder 250 to form a robust electrical and mechanical connection. Gases may be allowed to escape from the hole during soldering in the clearance between the terminal 130-2 and the interior surface of the hole (e.g. dimension W, FIG. 8B) which may be provided using differences in shape between the hole and the terminal 130-2.

At first glance, comparison of FIGS. 8A and 8B, may suggest a current carrying advantage in FIG. 8A which inherently allows the current through the terminal to flow through a plurality of the PCB layers vs a single layer in FIG. 8B. However, the surface area of the exposed conductive feature 210-5 making contact with the conductive layer(s) 237 in the hole in FIG. 8B may be much greater than the embodiment on FIG. 8A (depending on the number and thickness of exposed layers and the surface area of the hole) and limitations on the number and placement of conductive vias that may be distributed, e.g. within and around, each hole may be negligible in the embodiment of FIG. 8B compared with FIG. 8A because wear on a mechanical drill bit is not a concern with the laser formed holes. Thus, in the embodiment of FIG. 8B, with a laser drill, a plurality of conductive vias may be distributed in and around the area of the hole 136-2B to connect to a plurality of conductive layers for a more robust electrical and thermal connection.

Figure 9A:
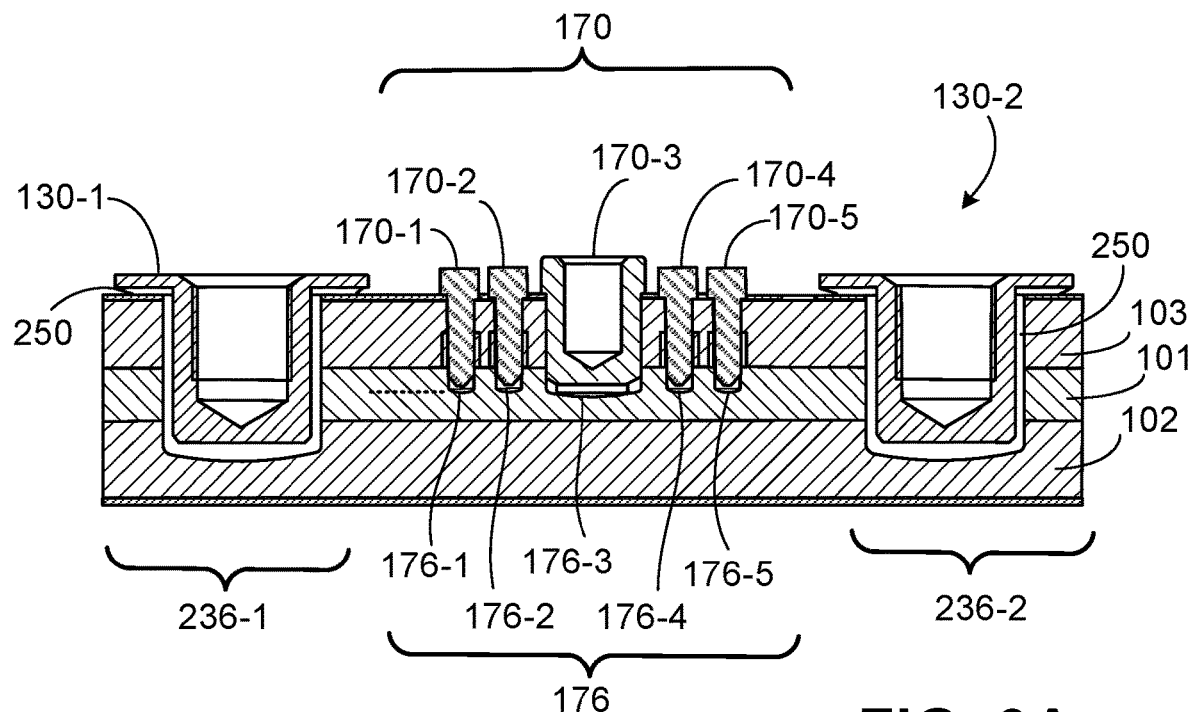
FIGS. 9A and 9B are cross-sectional views showing both soldered and press-fit terminals in plated holes.
Figure 9B:
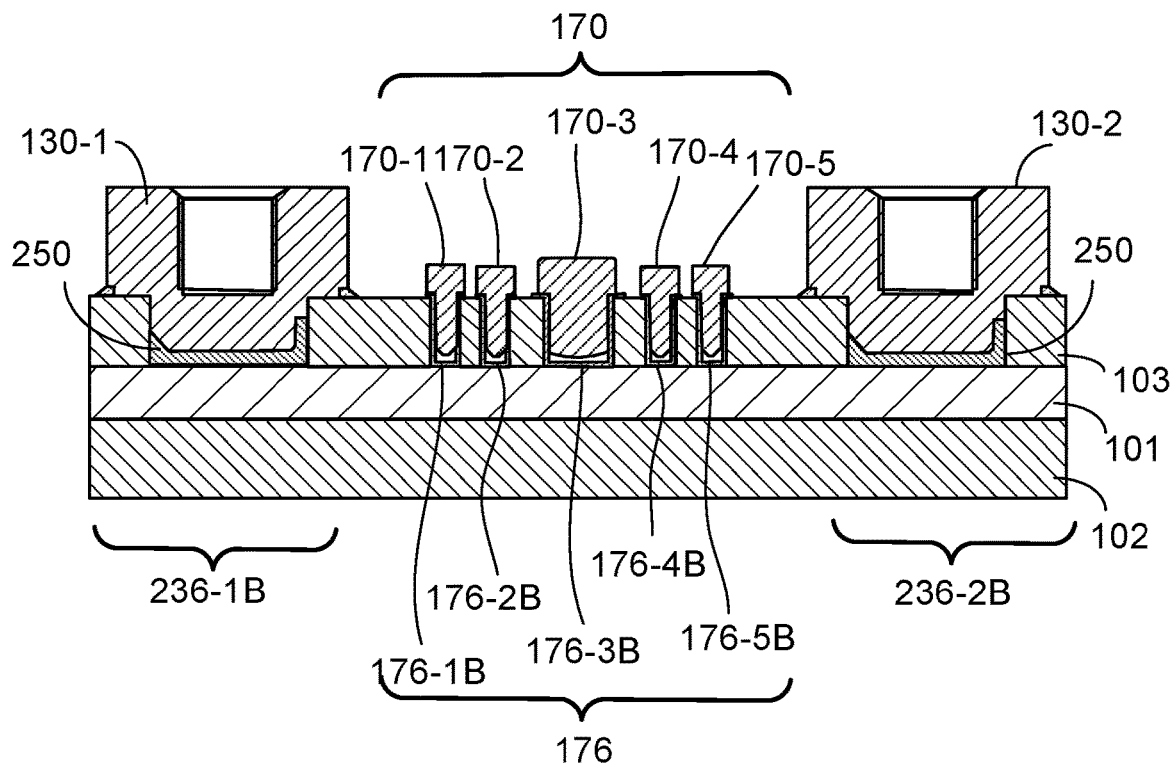

The cross-sectional views of FIGS. 9A and 9B show terminals 130-1, 130-2 and 170-3 soldered into their respective PCB-penetrating plated holes 236-1, 236-2, 176-3 (FIG. 9A) and non-PCB-penetrating holes 236-1B, 236-2B, 176-3B (FIG. 9B) and four terminals 170-1, 170-2, 170-4, 170-5 which may be press-fit within their respective PCB-penetrating plated holes 176-1, 176-2, 176-4, 176-5 (FIG. 9A) and non-PCB-penetrating plated holes 176-1B, 176-2B, 176-4B, 176-5B (FIG. 9B) as described below.

Figure 10:
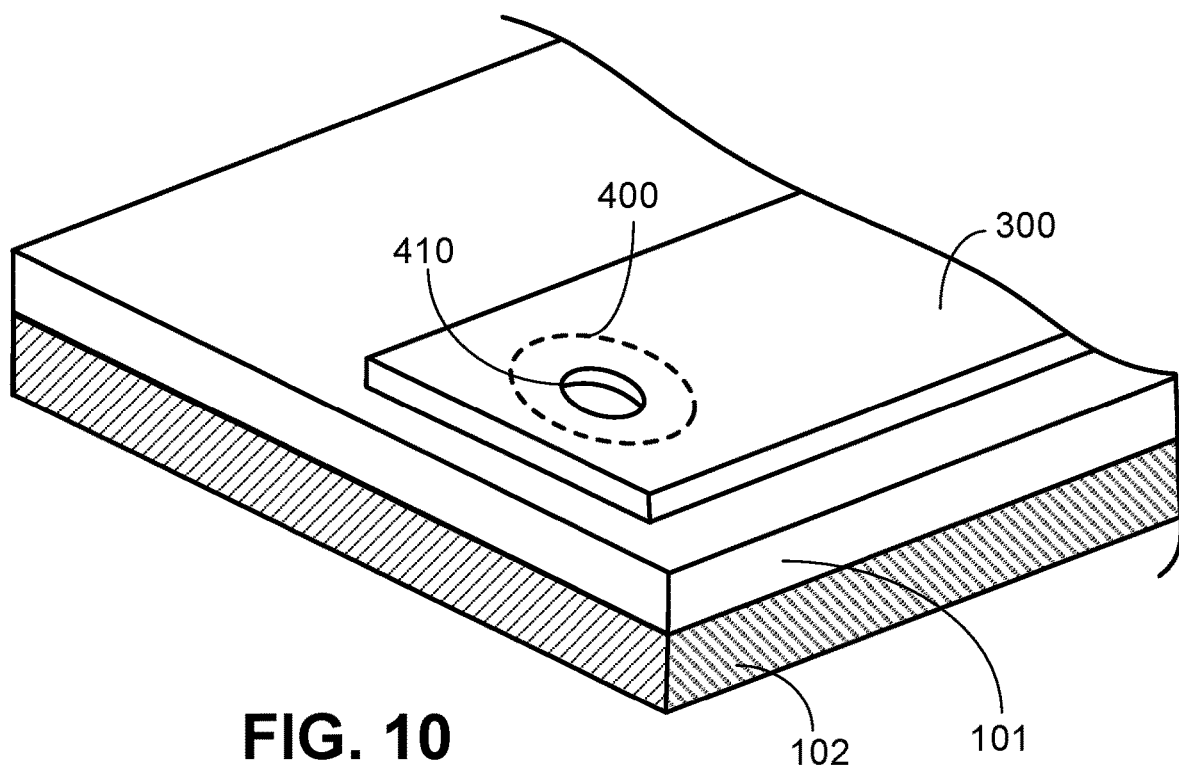
FIG. 10 shows a conductive feature on a surface of the internal substrate.

In some embodiments, one or more conductive components, e.g. conductive pucks 300 (FIGS. 10, 11), may be mounted on a surface, or surfaces, of the PCB 101 prior to encapsulation in locations that enable the conductive component to be exposed by the formation of a terminal hole. FIG. 10, which shows an isometric view of a module with the top layer of encapsulant removed, provides another example of a conductive component 300 arranged on the surface of PCB 101. The conductive component 300 may, e.g. be a copper plate or bar as shown or may have any suitable shape for the application. The dashed line 400 in FIG. 10 shows a location where a terminal hole may subsequently be formed. As shown, a hole 410 may be optionally provided in the conductive component near the intended terminal hole 400, e.g., to minimize wear on equipment, e.g. a drill, used to form the terminal hole, or decrease the process time for forming the hole, e.g. because of less metal requiring removal. Preferably, the hole 410 would be located, e.g. completely within, the intended terminal hole 400, to allow the formation of the latter to completely define the portion of the conductive component that is subsequently exposed in the terminal hole, providing improved accuracy and ensuring the terminal pin adequately engages the conductive component. In embodiments in which the terminal hole does not penetrate the PCB 101, the hole 410 may be omitted.

Figure 11B:
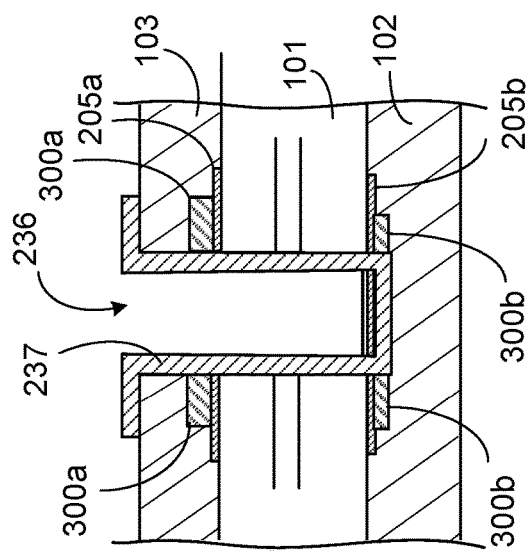
FIGS. 11A, 11B, 11C and 11D are cross-sectional views showing configurations of conductive components on the surfaces of an internal substrate.
Figure 11D:
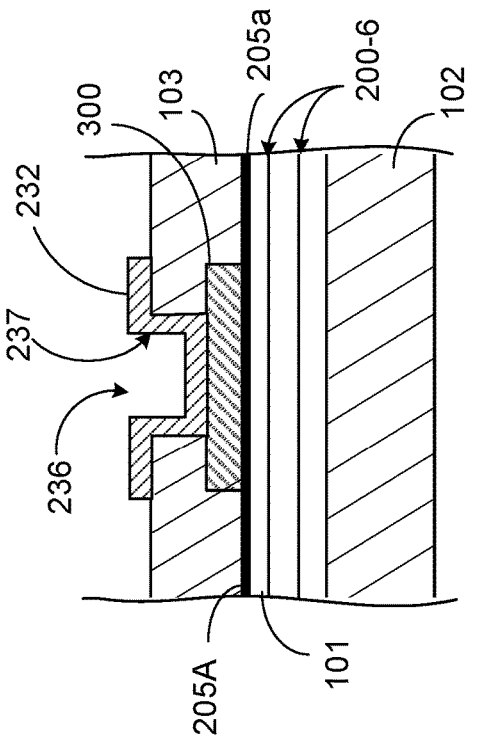
Figure 11A:
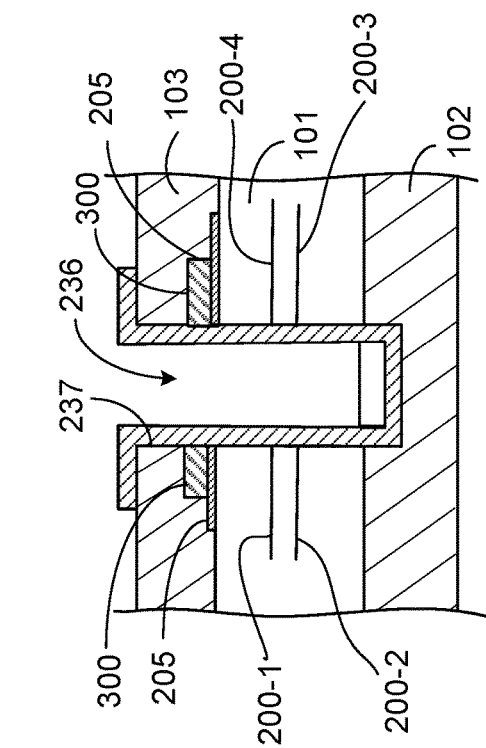
Figure 11C:
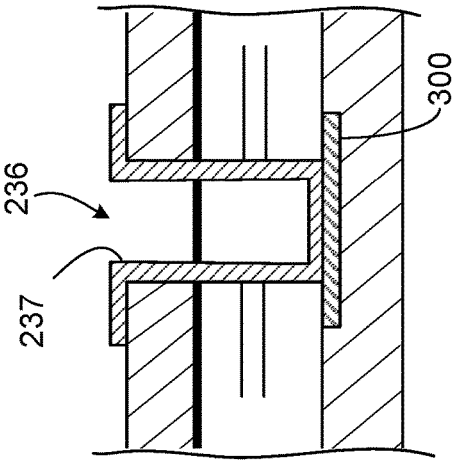

FIGS. 11A, 11B, 11C and 11D show several examples of alternate configurations using conductive components on one or more of the PCB surfaces. In FIG. 11A the conductive component 300 is placed on a top surface of the PCB 101 in contact with conductive trace 205, so that the plated terminal hole 236 passes through it. The plating 237 in the hole connects to exposed conductive rings 200-1 through 200-4 in the hole and to the conductive component 300. FIG. 11B shows a configuration in which the terminal hole 236 passes through conductive components 300*a*, 205*a*, 205*b*, 300*b* that are located on both top and bottom surfaces of the PCB 101. FIG. 11C shows a configuration in which the bottom of the terminal hole 236 contacts the conductive component on the surface of PCB 101. FIG. 11D shows a configuration in which the bottom of the non-PCB-penetrating terminal hole 236 contacts the conductive component 300 on the surface of PCB 101. A conductive component may be located over, and may be soldered to, a conductive trace on the PCB at the location of the terminal hole (e.g. conductive traces 205, 205*a*, 205*b*); it may be placed over bare portions of the surface of the PCB 101 at the location of the terminal hole and be connected at another location to circuitry on the PCB 101 (i.e. a bus bar); or it may be placed on a bare portion of the PCB only (i.e. for mechanical support). The examples of FIG. 11A through 11D are illustrative; it is understood that there are many possible configurations of conductive components and terminal holes. By providing additional cross-sectional area in the conduction path, the conductive component may reduce the equivalent series resistance of a terminal. It may also provide increased mechanical strength and rigidity.

Figure 12:
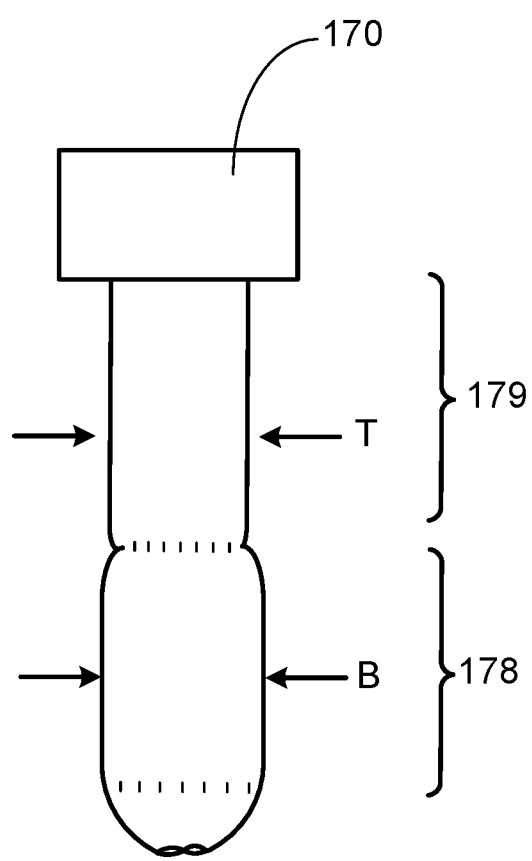
FIG. 12 shows a press-fit pin.
Figure 13:
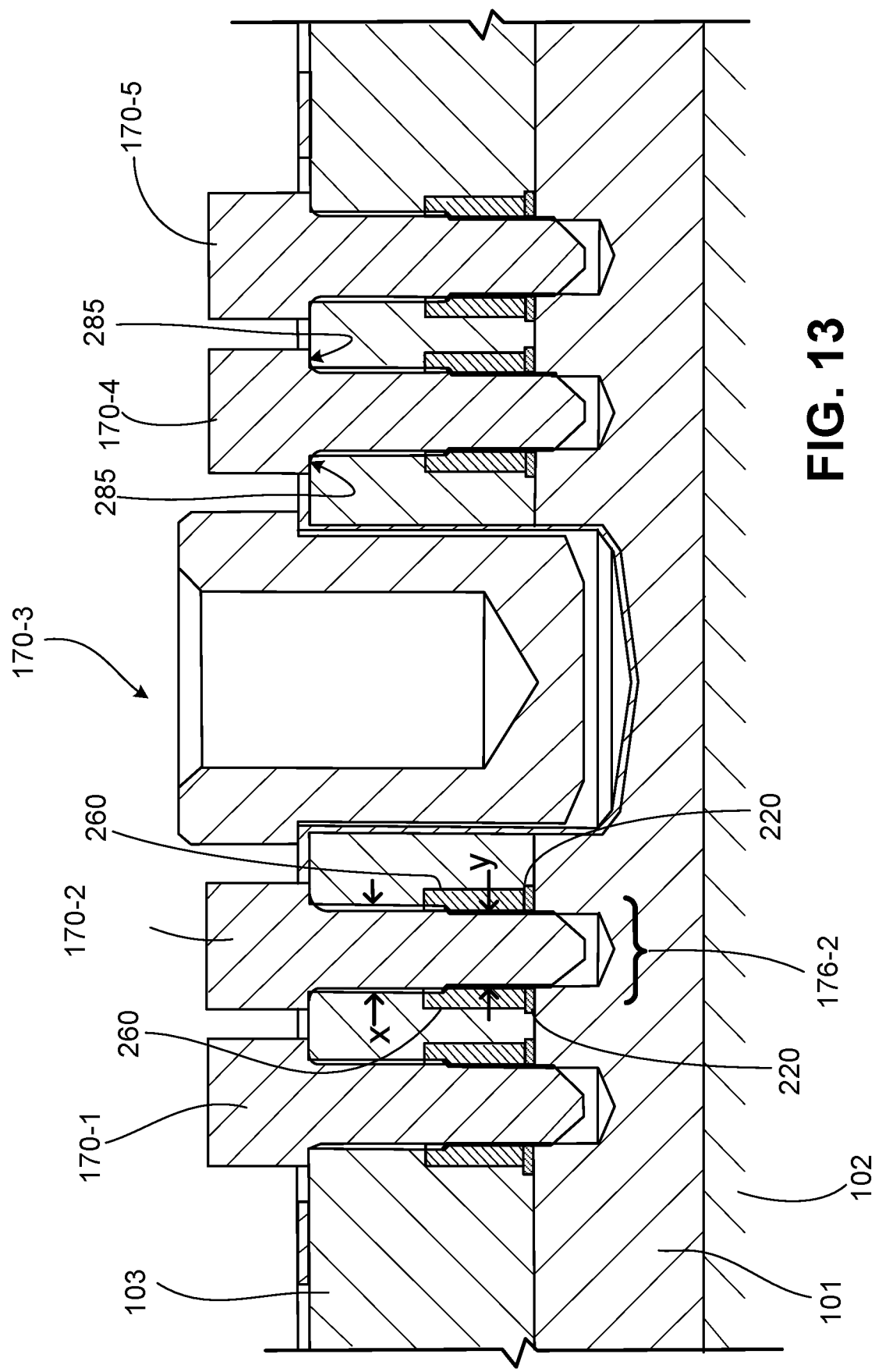
FIG. 13 shows a magnified portion of FIG. 9A.

An example of press-fit pin terminals will be described with reference to FIGS. 12 and 13, which respectively show a press-fit pin 170; and a magnified view of a portion of FIG. 9A that includes pins 170-1, 170-2, 170-3, 170-4, 170-5. As shown in FIG. 13, an optional conductive component, e.g. "puck" 260, is soldered or otherwise electrically connected to a respective conductive trace or pad (e.g. pad 220) on PCB 101 for each of pins 170-1, 170-2, 170-4, 170-5 in the pin's respective location. Each puck is preferably made of a malleable electrically conductive material, e.g. copper, may form a substantial part of the electrical connection between the pin and the respective PCB trace, and provide mechanical support for the press-fit pin. The conductive features, e.g. puck 260, may be buried by the encapsulation process, after which, each puck may be exposed by formation of a respective hole, e.g. PCB-penetrating holes 176-1, 176-2, 176-3, 176-4, 176-5, e.g. drilled. Each hole may pass through encapsulant layer 103 and, in the example shown, through the respective puck 260 and optionally through all, or preferably only a portion of, PCB 101. As indicated in FIG. 13, the hole preferably may be formed to have a diameter X of an upper portion that is larger than a diameter Y of a lower portion (e.g. by use of two drill bits or a single stepped drill bit, etc.). The press-fit pin 170, shown prior in FIG. 12, may have a lower portion 178 that is larger in diameter than an upper portion 179 (i.e., in FIG. 12, diameter B is greater than diameter T). The diameter B of the pin lower portion 178 may be greater than the diameter, Y, of the lower portion of hole 176-2, but preferably less than the diameter X of the upper portion of hole 176-2 to facilitate compression of the lower portion of the pin 178 by the smaller internal diameter of the puck 260 when pin 170-2 is pressed into hole 176-2. This frictional compressive fit may secure the pin mechanically and may also ensure a low resistance, high quality, electrical connection between the pin and the conductive puck. In some applications, adhesive may be placed between the head of pin 170 and the surface of encapsulant layer 103 (e.g. at location 285, FIG. 13). Alternatively, the press-fit pins 170 may engage with the sidewall of the holes without the use of conductive pucks mounted to the PCB, e.g. directly with either the PCB or with the metalized holes.

It should be appreciated that plating inside of one or more of through-holes 160-1, 160-2, 160-3, 160-4 (FIGS. 1, 3, 5) may connect to circuitry on the PCB 101, e.g. connecting the shield 150 to internal circuitry within the module, e.g., to a circuit ground. Similarly, the plating inside the one or more blind-holes, e.g. holes 136-1, 136-2, 146-1, 146-2, 176-1, 176-2, 176-3, 176-4, 176-5, may selectively connect to portions of the internal circuitry providing electrical terminals, such as power input, power output, and control signals in the case of a power converter.

Figure 14:
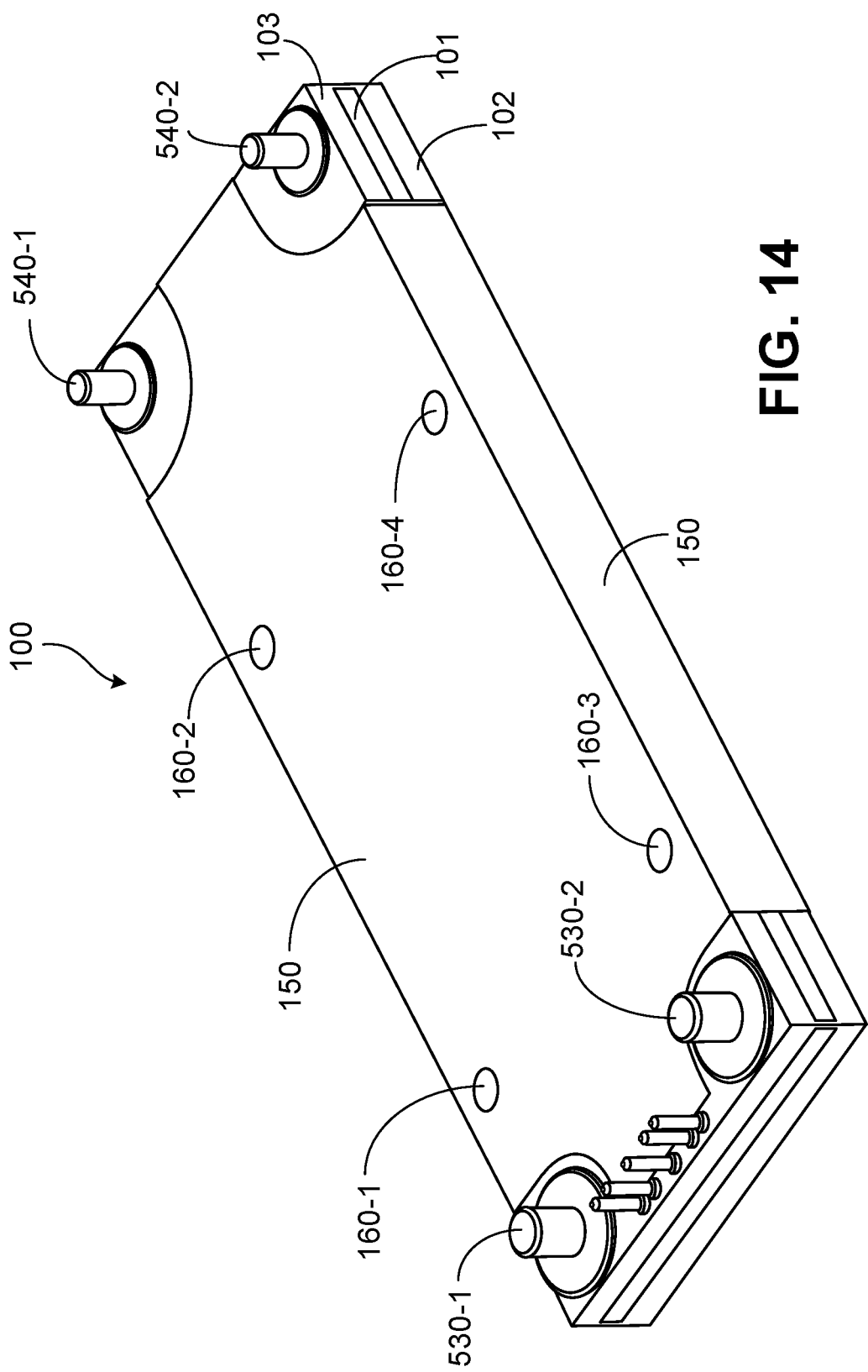
FIG. 14 shows an isometric view of an electronic module.
Figure 15:
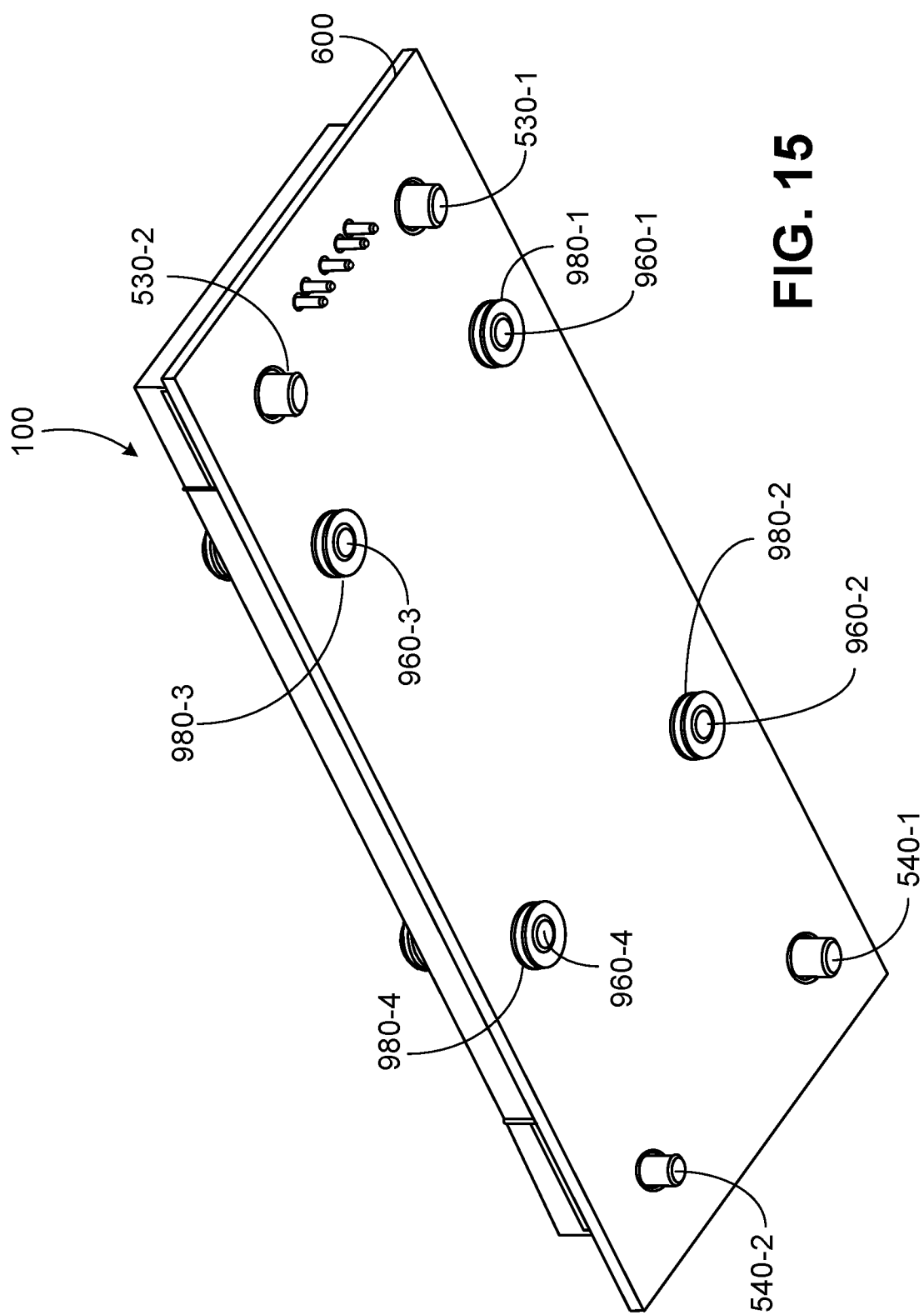
FIGS. 15 and 16 show isometric views of the module of FIG. 14 mounted to an external printed circuit board.
Figure 16:
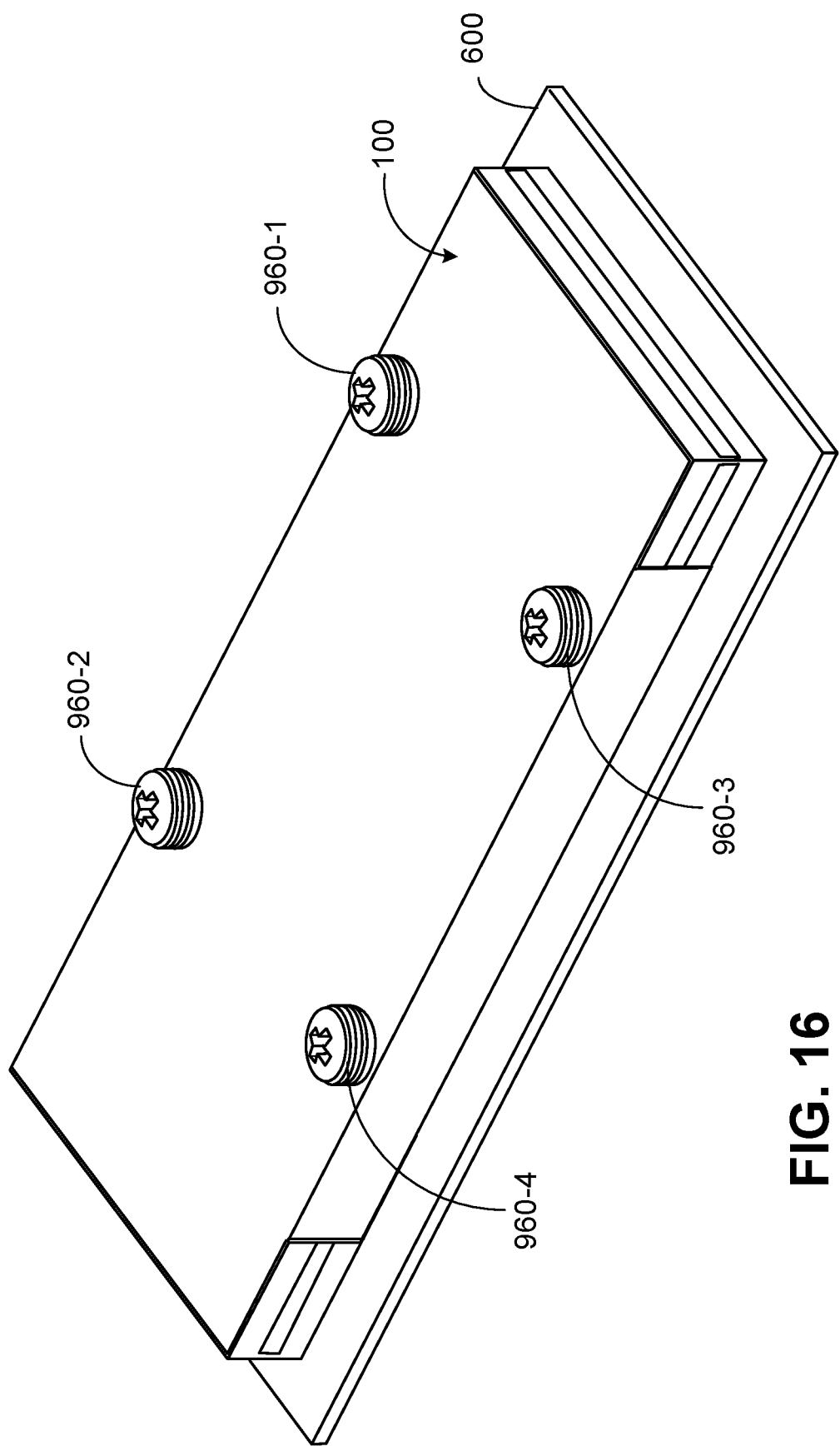
Figure 17:
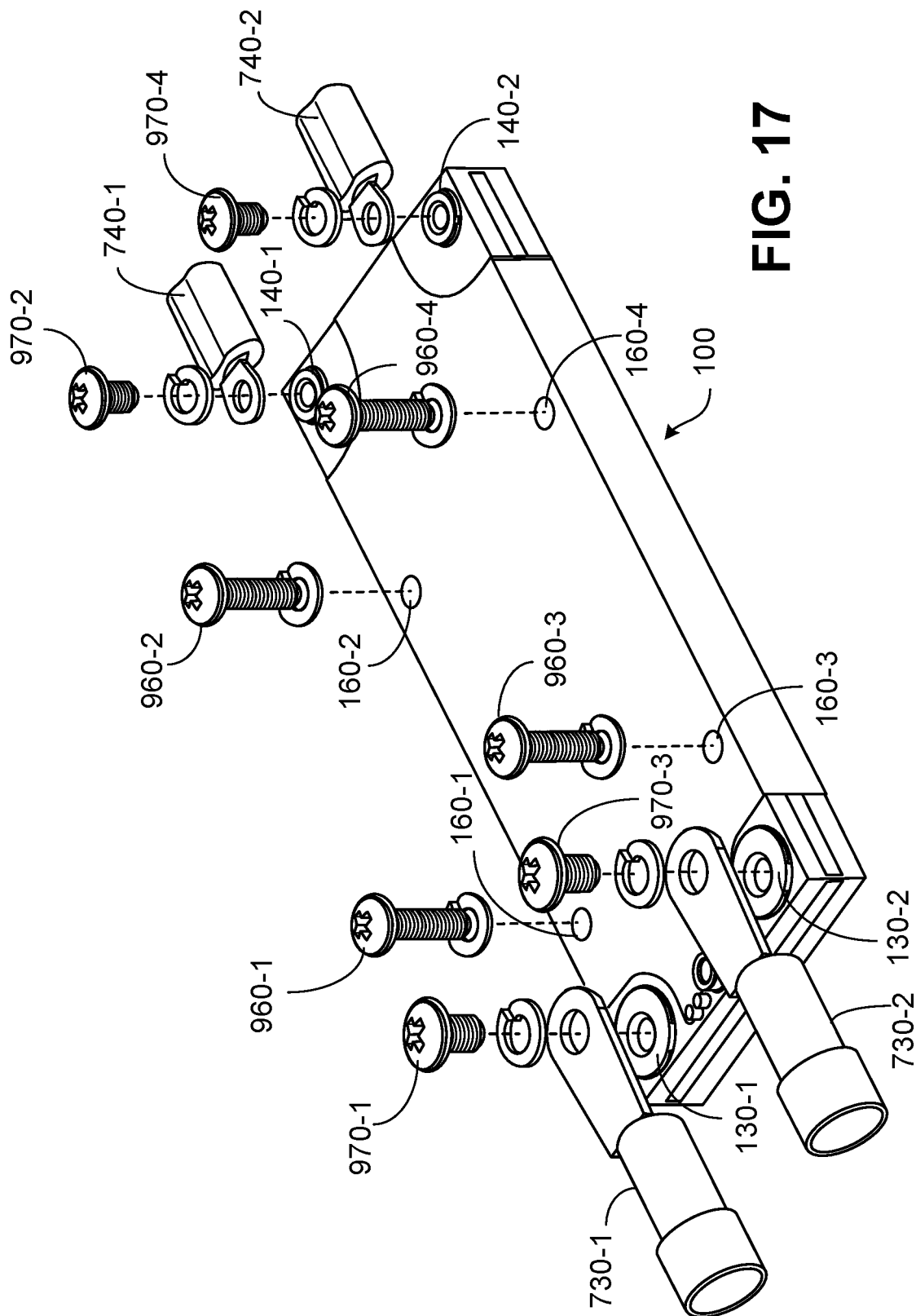
FIG. 17 shows an exploded isometric view of a configuration in which external connections to an electronic module comprise ring lugs.

A wide variety of terminal and mounting configurations are possible. FIG. 14, for example, shows a module 100 having terminals 530-1, 530-2, 540-1, 540-2 comprising columnar studs that extend beyond a surface of the module and that may be used to connect the module, as illustrated in FIGS. 15 and 16, to an external printed circuit board 600 or connectors. In FIGS. 15 and 16, the module 100 is secured to the external PCB 600 by means of screws 960-1 through 960-4, which pass through through-holes 160-1 through 160-4, and threaded nuts or inserts 980-1 through 980-4. Columnar studs on terminals 530-1, 530-2, 540-1, 540-2 pass through holes in external PCB 600 and may be soldered to etches (not shown) on the external PCB or alternatively may engage with connectors (not shown). FIG. 17 shows an exploded view of another configuration in which ring lugs 730-1, 730-2, 740-1, 740-2 are secured to respective internally threaded terminals 130-1, 130-2, 140-1, 140-2 by means of screws 970-1 through 970-4. In FIG. 17, mounting screws 960-1 through 960-4 may be inserted into through-holes 160-1 through 160-4 to secure the module to, e.g. an external chassis or heat sink assembly (not shown). It should be appreciated that a wide variety of terminal shapes and sizes may be used. For example, terminals may be inserted into the holes that may be sized, cut, or ground to be coplanar with the surface of the finished module, or extend slightly above or below the module surface to provide connection bumps, or indentations.

II. Surface Mount Trench Terminals

Figure 18A:
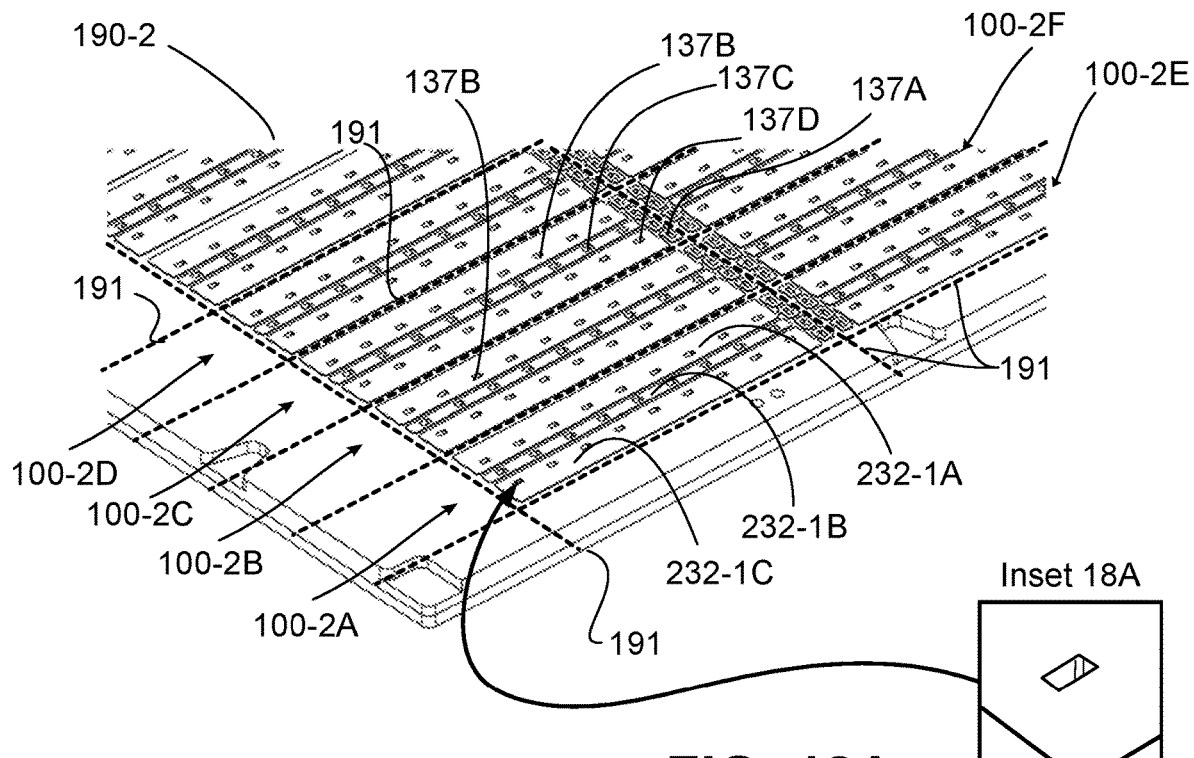
FIG. 18A shows a modified panel with cut lines after metallization.
Figure 18B:
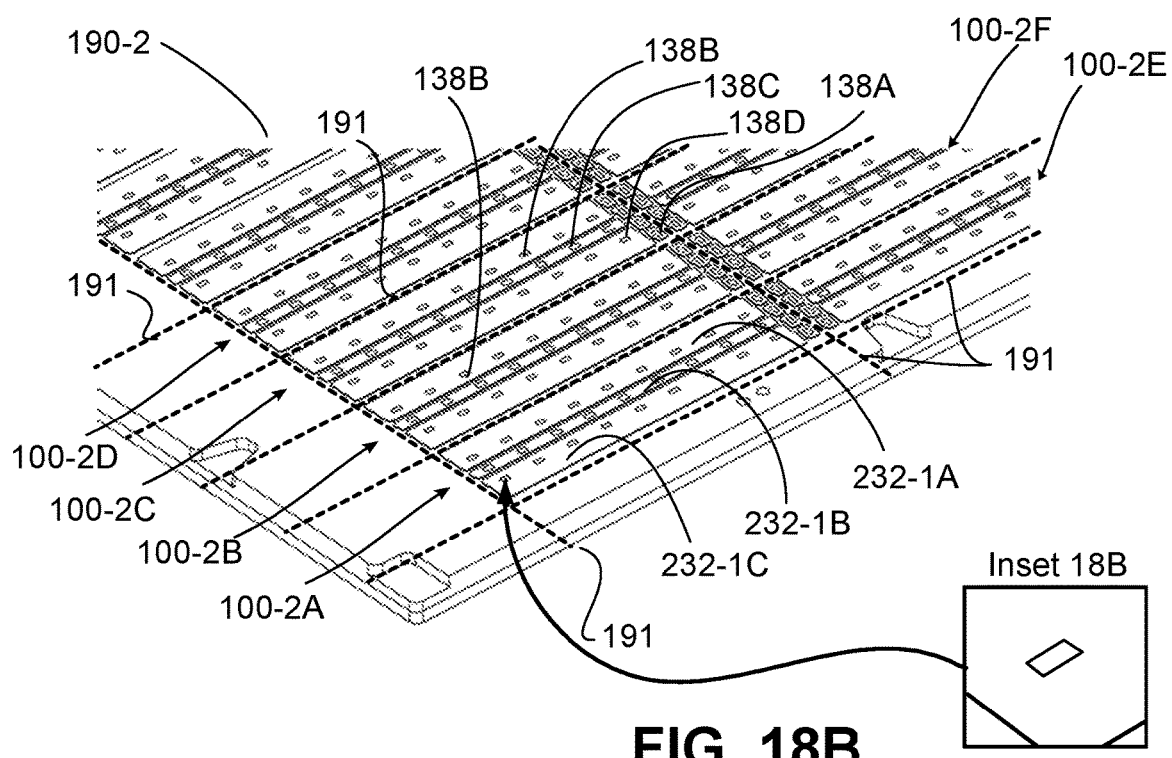
FIG. 18B shows the panel of FIG. 18A after solder deposition.

An alternative "trench" type terminal may be used without the terminal inserts, e.g. inserts 130-1, 140-1, (FIGS. 1-2, 8-9), inserts 530-1 540-1 (FIG. 14), pins 170-1, 170-3 (FIGS. 1-2, 12-13) described above. Referring to FIGS. 18A and 18B, which partially show encapsulated panels 190-2, comprising a large multiplicity of un-singulated electronic modules, e.g. 100-2A, 100-2C, each having a plurality of electrical trench terminals, e.g. terminals 137A, 137B, 137C, 137D (FIG. 18A). The example of FIGS. 18A and 18B assumes panels 190-2 of the same size, and un-singulated modules, e.g. 100-2A, 100-2B, 100-2C, 100-2D, 100-2E, 100-2F, of a size much smaller than, those (panels 190, un-singulated modules 100) in the previous examples of FIGS. 1-6 and 14-17. The un-singulated modules, 100-2, may be delineated by cut lines 191, which in contrast to the example of FIGS. 1-6, do not pass through any metalized slots or holes as shown in FIGS. 18A, 18B, i.e. the perimeter contacts described in the Multi-Surface Application are not employed in this example. The trench terminals 137A, 137B, 137C, 137D as shown in FIG. 18A are unfilled plated holes (see Insert 18A for a magnified view of an unfilled plated hole) in contrast to the trench terminals 138A, 138B, 138C, 138D shown in FIG. 18B as filled (see Insert 18B for a magnified view of a filled plated hole). The plated holes may be filled partially or completely with a curable compound, e.g. epoxy, preferably conductive, to leave a controlled volume of the trench unfilled, e.g. the controlled volume may range from 0 to 100 percent unfilled, for subsequent solder deposition or additional plating onto the cured compound in the trench or hole. Alternatively, the trench terminals may be filled partially or completely during the plating process, e.g., by plating, leaving a dimple or approximately flat pad, in or on which solder paste may optionally be deposited.

The metal formed on a surface of the modules 100-2 may be patterned as necessary for the application, e.g. in FIGS. 18A, 18B the metal on the top surface is shown patterned into strips, e.g. metal strips 232-1A, 232-1B, and 232-1C, for a power converter application. Each strip 232-1A, 232-1B, and 232-1C, may include a plurality of trenches, 137B, 137C, and 137D, respectively providing a plurality of connections to each metal strip, for example to provide high current connections, as shown in FIG. 18A. One or more additional trench terminals 137A may be isolated from the metal strips 232-1A, 232-1B, 232-1C to provide lower current signal connections, e.g. timing and control signals, to the module, e.g. at an end of each module as shown in the example of FIGS. 18A and 18B. Typically, one surface of the module may be dedicated for electrical connections to the system in which it is installed, e.g. surface mounted, and the opposite surface may be use for shielding and or heat removal, e.g. attached to a heatsink or cold plate, in which case the metal may cover the entire opposite surface with or without a setback from the edges of the module, e.g. cut lines 191. The metal on the opposite surface, e.g. the shield, may also include trench terminals of the type shown in FIGS. 18A and 18B. The trenches in the surface of the panel may be partially or completely filled, e.g. with one or more fillers to form the terminals, e.g. the trenches may be partially filled with a curable compound such as an epoxy and then filled with solder paste for subsequent attachment to a system board or other device. For example, the curable compound may be cured before filling or partially filling the trenches with the solder paste.

III. Fabrication Process Flow

Figure 19A:
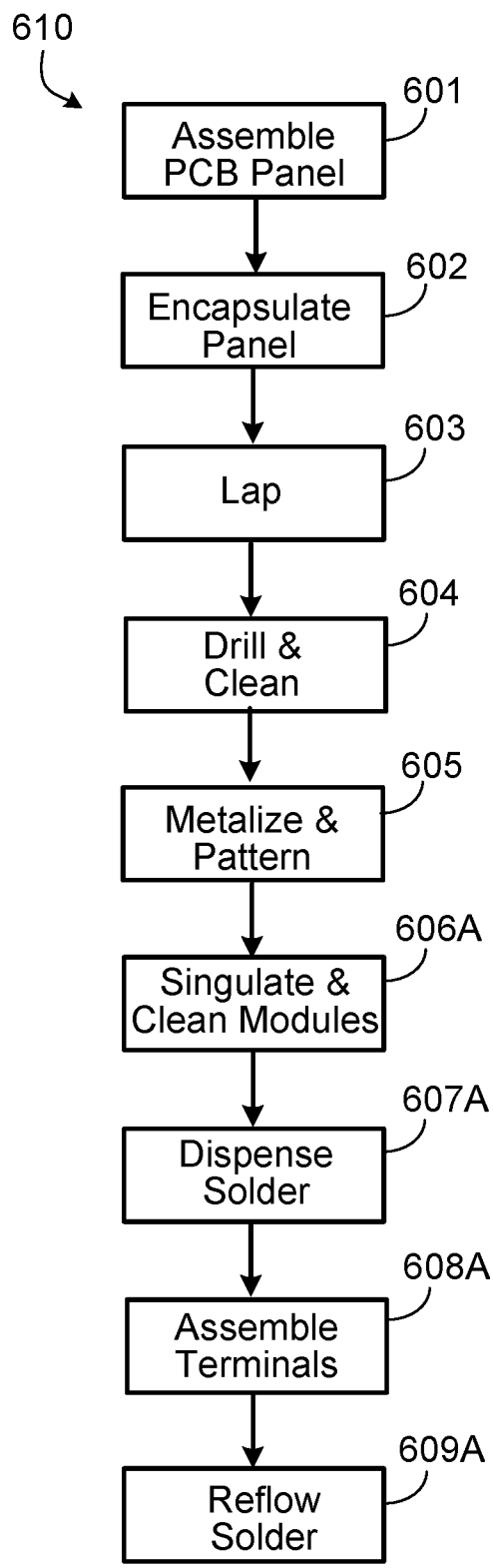
FIGS. 19A and 19B show process flow charts for fabricating the modules.
Figure 19B:
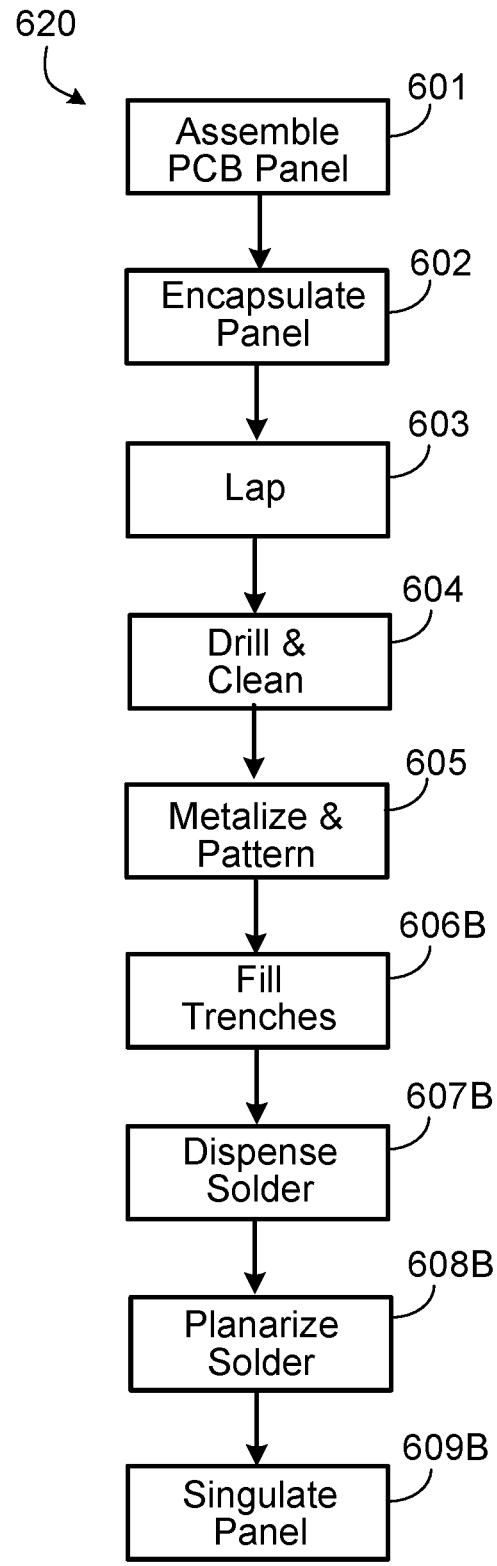

The processes for fabricating the above modules using insert terminals or trench terminals are summarized in the flow charts 610 and 620 of FIGS. 19A and 19B. The process 610 in FIG. 19A illustrates the preferred singulate before terminal assembly method described above for building modules with terminal inserts. The PCB panels may be assembled as shown in step 601, e.g. attaching the various components to the PCB; the assembled panels being encapsulated in step 602, and the encapsulated panels being lapped in step 603, e.g. for thickness and planarity control. The terminal holes, e.g. blind holes 176, 136, and 146 (FIG. 3), through holes 160 (FIG. 3), and optional slots 221, 225, 226 (FIG. 4) may be formed, preferably using a laser to remove the encapsulant to a controlled depth, preferably to the first metal layer on the PCB for the blind holes, and then panels may be cleaned as shown in step 604. The panels may be metalized as shown in step 605, which may include forming metal inside the holes and optional slots, and may include additive or subtractive patterning to form the requisite pattern, e.g. metal shield, clearance between terminal holes and shield, and conductive features on the surface around the terminal holes, e.g. in regions 231, 232, 233, 234 (FIGS. 5-6) on the surfaces of the panels as described above. The panel may be cut to singulate the individual modules which may then be cleaned as shown in step 606A; after which solder may be dispensed to the blind terminal holes as shown in step 607A. The terminals may be inserted into their respective holes as shown in step 608A and the solder reflowed as shown in step 609A to complete the process.

The singulate and clean step 606A of process 610 may be moved to the end after the reflow step 609A should the terminal assembly before singulate process be preferred.

It will be appreciated that any size or shape solder terminals may be provided according to the needs of the application. Finally, the panels may be cut along the cut lines, e.g. lines 191-198 in FIG. 3, to singulate the individual modules, e.g. modules 100A, 100B (FIG. 3).

The trenches for the trench terminals may be formed using the same techniques described above for holes 136-2B in FIG. 7B. For example, the process for making the trench terminals may start from just after the PCB panel is encapsulated as described in the Multi-Surface Application and may preferably use non-PCB-penetrating holes similar to those described above in connection with FIG. 7B, however, the size of the holes for forming the trench terminals is preferably much smaller than those described above for the terminal inserts, and may preferably have non-circular geometries, e.g. length to width aspect ratios that allows for effecting metal plating in the holes, all making them particularly amenable to formation by laser drilling. As shown in FIG. 18A, the trench holes 137A, 137B, 137C, and 137D, may be oval slots for example. Slots may be preferable to round holes for small hole dimensions to allow the inner walls of the slot to be plated during subsequent metal layer formation.

The process 620 for fabricating the trench terminals is summarized in FIG. 19B, which shows the PCB panels being assembled in step 601, the assembled panels being encapsulated in step 602, the encapsulated panels being lapped in step 603, e.g. for thickness and planarity control, and then the trenches, e.g. slots, are formed, preferably using a laser to remove the encapsulant to a controlled depth, preferably to the first metal layer on the PCB and the panels cleaned in step 604, and then metalized in step 605, which includes forming metal inside the trenches or slots, and may include additive or subtractive patterning to form the requisite conductive features, e.g. metal strips, signal terminals, and shields on the surfaces of the panels as described above. The slots may optionally be substantially filled with metal by the plating process, or alternatively filled afterward with a curable compound, which may preferably be conductive as shown in step 606B. Solder may be dispensed to the filled or unfilled slots as shown for step 607B and then may be optionally planarized, e.g. by applying a compressive force, to a controlled height, e.g. a uniform height for the dispensed solder as shown in step 608B. Finally, the panels may be cut along the cut lines, e.g. lines 191 in FIGS. 18A and 18B, to singulate the individual modules, e.g. modules 100-2A, 100-2B (FIGS. 18A and 18B).

Several embodiments of the invention have been described. Nevertheless, it will be understood that various modifications may be made without departing from the spirit and scope of the invention. For example, it will be appreciated that any size or shape terminal or trench may be provided according to the needs of the application. Although a continuous shield 150 has been shown above as an example of plating on the surface of a module, the plating may be configured in a virtually limitless number of ways, including forming electrical contacts on the outside of the module that enable connecting internal module circuitry to external components or other modules. Examples of "bar code" etches shown herein were limited, for clarity of illustration, to relatively few layers on the internal PCB. The number of layers in a particular embodiment is a function of the application and may be relatively small (e.g. 2 layers, 5 layers) or relatively large (e.g., 11 layers, 30 layers).

Accordingly, other embodiments are within the scope of the following claims.

What is claimed is:

1. A method of forming electronic modules, the method comprising:
    assembling an electronic module including a multilayer printed circuit board ("PCB") having a plurality of conductive layers, a first plurality of electronic components mounted to a first surface of the PCB, and a first layer of cured encapsulant covering the components and the surface of the PCB, the first layer of cured encapsulant forming a first exterior surface of the module, the electronic module including one or more conductive features buried beneath the first exterior surface;
    selectively forming one or more terminal holes in the first exterior surface through the first layer by removing the cured encapsulant at predetermined locations within perimeter boundaries of the electronic module, exposing within the one or more terminal holes respective portions of the one or more conductive features;
    inserting a conductive terminal into each of the one or more terminal holes; and
    forming an electrical connection between the conductive terminal and the respective portions of the one or more conductive features exposed within each of the one or more terminal holes;
    wherein assembling the electronic module comprises providing a PCB panel, mounting a plurality of electronic components to first and second surfaces of the PCB panel, encapsulating the PCB panel and electronic components to form an encapsulated panel, the encapsulated panel comprising a plurality of the electronic modules, and cutting the encapsulated panel to singulate the electronic modules.

2. The method of claim 1 wherein the forming an electrical connection for selected terminal holes includes forming a pressure fit between the respective conductive terminal and the respective portions of the one or more conductive features exposed within the selected terminal holes.

3. The method of claim 1 wherein the assembling the electronic module includes mounting at least one conductive component to the PCB, the at least one conductive component being covered by the first layer of cured encapsulant, and wherein forming the one or more terminal holes includes exposing the conductive component in a respective one of the terminal holes.

4. The method of claim 3 wherein the conductive component includes a hole feature covered by the first layer of cured encapsulant and approximately aligned with a location of the respective one of the terminal holes, and the forming the respective one of the terminal holes exposes the hole feature.

5. The method of claim 1, further comprising selectively forming one or more conductive metal layers on a sidewall surface within each of selected terminal holes in electrical contact with the respective portions of the one or more conductive features exposed within the selected terminal holes.

6. The method of claim 1, further comprising:
    selectively forming one or more mounting holes in the first exterior surface through the first layer at predetermined locations within perimeter boundaries of the electronic module, each mounting hole intersecting a respective second set of the conductive features to expose respective portions of the respective second set of conductive features in the respective mounting hole; and
    selectively forming one or more conductive metal layers on the first external surface and on a sidewall surface within each of selected mounting holes in electrical contact with the exposed respective portions of the respective second set of conductive features in the respective mounting hole to form a conductive metal mounting pad on the first exterior surface surrounding the respective mounting hole, the metal mounting pad being continuous with the one or more conductive metal layers on the interior surface of the respective mounting hole and providing an electrical contact on the first exterior surface connected to the exposed respective portions of the respective second set of the conductive features.

7. The method of claim 6, further comprising patterning the one or more metal layers on the first exterior surface to form a metal shield electrically connected to at least one of the metal mounting pads and covering at least 25 percent of the first exterior surface.

8. The method of claim 7 wherein the metal shield covers at least 50 percent of the exterior module surface and connects a plurality of the mounting holes.

9. The method of claim 6 wherein at least one of the mounting holes extends completely through the module.

* * * * *

UNITED STATES PATENT AND TRADEMARK OFFICE
CERTIFICATE OF CORRECTION

PATENT NO. : 11,304,297 B1
APPLICATION NO. : 17/026567
DATED : April 12, 2022
INVENTOR(S) : Vinciarelli et al.

It is certified that error appears in the above-identified patent and that said Letters Patent is hereby corrected as shown below:

On the Title Page

Page 2, Column 2, under "OTHER PUBLICATIONS," Line 8, delete ")(Year: 2008)".

Page 2, Column 2, under "OTHER PUBLICATIONS," Line 13, delete ")(Year: 2002".

In the Specification

Column 5, Line 65, delete "each of the of" and insert -- each of the --.

Signed and Sealed this
Thirtieth Day of August, 2022

*Katherine Kelly Vidal*
Katherine Kelly Vidal
*Director of the United States Patent and Trademark Office*